United States Patent
Meador et al.

(10) Patent No.: US 8,383,318 B2
(45) Date of Patent: Feb. 26, 2013

(54) ACID-SENSITIVE, DEVELOPER-SOLUBLE BOTTOM ANTI-REFLECTIVE COATINGS

(75) Inventors: Jim D. Meador, Manchester, MO (US); Joyce A. Lowes, Gerald, MO (US); Ramil-Marcelo L. Mercado, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 406 days.

(21) Appl. No.: 12/708,630

(22) Filed: Feb. 19, 2010

(65) Prior Publication Data

US 2010/0213580 A1    Aug. 26, 2010

Related U.S. Application Data

(60) Provisional application No. 61/153,909, filed on Feb. 19, 2009.

(51) Int. Cl.
*G03F 7/00* (2006.01)
*G03F 7/004* (2006.01)
*G03F 7/028* (2006.01)
*G03F 7/095* (2006.01)

(52) U.S. Cl. ............... 430/270.1; 430/271.1; 430/913; 430/927

(58) Field of Classification Search ............. 430/270.1, 430/271.1, 913, 927
See application file for complete search history.

(56) References Cited

U.S. PATENT DOCUMENTS

| | | | |
|---|---|---|---|
| 6,054,254 A | 4/2000 | Sato et al. | |
| 6,844,131 B2 | 1/2005 | Oberlander et al. | |
| 7,601,483 B2 * | 10/2009 | Guerrero et al. | 430/311 |
| 2005/0214674 A1 | 9/2005 | Sui et al. | |
| 2007/0178406 A1 | 8/2007 | Vohra et al. | |
| 2008/0038666 A1 | 2/2008 | Wu et al. | |
| 2008/0090184 A1 | 4/2008 | Sui et al. | |
| 2009/0098490 A1 * | 4/2009 | Pham et al. | 430/327 |
| 2009/0104559 A1 | 4/2009 | Houlihan et al. | |
| 2009/0130592 A1 | 5/2009 | Wang | |
| 2009/0317747 A1 * | 12/2009 | Guerrero et al. | 430/311 |
| 2010/0119972 A1 | 5/2010 | Houlihan et al. | |

FOREIGN PATENT DOCUMENTS

| | | |
|---|---|---|
| EP | 1 803 708 | 7/2007 |
| JP | 2005-120214 | 5/2005 |
| WO | 81/03657 | 12/1981 |
| WO | 03057678 | 7/2003 |
| WO | 2005093513 | 10/2005 |
| WO | 2009105556 | 8/2009 |

OTHER PUBLICATIONS

Chen et al., "Resist Freezing Process for Double Exposure Lithography," 2008, Proc. of SPIE, vol. 6923, 69230G-1-69230G-10.

(Continued)

*Primary Examiner* — Amanda C. Walke
(74) *Attorney, Agent, or Firm* — Hovey Williams LLP

(57) ABSTRACT

Acid-sensitive, developer-soluble bottom anti-reflective coating compositions are provided, along with methods of using such compositions and microelectronic structures formed thereof. The compositions preferably comprise a crosslinkable polymer dissolved or dispersed in a solvent system. The polymer preferably comprises recurring monomeric units having adamantyl groups. The compositions also preferably comprise a crosslinker, such as a vinyl ether crosslinking agent, dispersed or dissolved in the solvent system with the polymer. In some embodiments, the composition can also comprise a photoacid generator (PAG) and/or a quencher. The bottom anti-reflective coating compositions are thermally crosslinkable, but can be decrosslinked in the presence of an acid to be rendered developer soluble.

27 Claims, 12 Drawing Sheets

OTHER PUBLICATIONS

Fukushima et al., "Leading-edge adamantyl polymers designed for 193 nm lithography," 2008, Proc. of SPIE, vol. 6923, 692335-1-692335-9.

Furukawa et al., "Evaluation of adamantane derivatives for chemically amplified resist—a comparison between ArF, EUV and EB exposures," 2008, Proc. of SPIE, vol. 6923, 692334-1-692334-12.

Houlihan et al., "Second Generation Radiation Sensitive 193 nm Developable Bottom Anti Reflective Coatings (DBARC): Recent Results," 2008, Proc. of SPIE, vol. 6923, 692330-1-692330-7.

Ito et al., "Lactones in 193 nm resists: What do they do?" 2008, Proc. of SPIE, vol. 6923, 692318-1-692318-12.

Nakayama et al, "Synthesis and evaluation of novel resist monomers and copolymers for ArF lithography II," 2008, Proc. of SPIE, vol. 6923, 69233F-1-69233F-8.

Tanaka et al., "Adamantane-based molecular glass resist for 193-nm lithography and beyond," 2008, Proc. of SPIE, vol. 6923, 69231J-1-69231J-8.

Wang et al., "Synthesis and Properties of New Anionic Photoacid Generators Bound Polymer Resists for e-beam and EUV lithography," 2008, Proc. of SPIE, vol. 6923, 692312-1-692312-7.

Cameron et al., "Progress Towards Production Worthy Developable BARCS (DBARCS)," 2009, Proc. of SPIE, vol. 7273, 72733L-1-72733L-13.

International Search Report and Written Opinion dated Sep. 30, 2010 in corresponding PCT/US2010/024664 filed on Feb. 19, 2010.

International Preliminary Report on Patentability dated Sep. 1, 2011 in corresponding PCT/US2010/024664 filed on Feb. 19, 2010.

Meador et al., "Improving the performance of light-sensitive developer-soluble anti-reflective coatings by using adamantyl terpolymers," 2009, Proc. of SPIE, vol. 7273, 727312-1-727312-9.

Adamantate, Adamantane, Idemitsu Kosan Co., Ltd., www.idemitsu.com, 2010.

Meador et al., "Photoresist-induced development behavior in DBARCS," 2010, Proc. of SPIE, vol. 7639, 11 pages.

\* cited by examiner

Example 2      Example 5      Example 8      Example 14

1.6 seconds           1.8 seconds           2.0 seconds
a) 38 nm of bottom anti-reflective coating made in Example 3

1.6 seconds           1.8 seconds           2.0 seconds
b) 54-55 nm of bottom anti-reflective coating made in Example 3

1.6 seconds  1.8 seconds 1.4 seconds  1.6 seconds  1.8 seconds 1.6 seconds  1.8 seconds  2.0 seconds Best focus, 130-nm resolution Best focus, 130-nm resolution a) Resolution (nm) at 0.0 μm focus b) 130-nm L/S (1:1 and 1:1.5) at 0.0 and +0.1 μm focus

ACID-SENSITIVE, DEVELOPER-SOLUBLE BOTTOM ANTI-REFLECTIVE COATINGS

CROSS-REFERENCE TO RELATED APPLICATIONS

The present application claims the priority benefit ANTI-REFLECTIVE COATINGS WITH ACID-CLEAVABLE, ADAMANTYL MONOMER IN BINDER POLYMER, Ser. No. 61/153,909, filed Feb. 19, 2009, incorporated by reference in its entirety herein.

BACKGROUND OF THE INVENTION

1. Field of the Invention

The present invention relates to new wet-developable, bottom anti-reflective coatings formed using adamantyl monomers in the polymer and having excellent reflectivity control and good photoresist compatibility.

2. Description of Related Art

With the integrated circuit (IC) industry continuing to move to smaller feature sizes to increase information storage capabilities, outstanding anti-reflective techniques will be required to provide the needed critical dimension (CD)) control for 193-nm lithography. Bottom anti-reflective coatings will be the anti-reflective materials of choice for critical and even noncritical applications such as implant. Using a dyed resist with top anti-reflective coating will not be sufficient for 45-, 32-, and 22-nm node implant layers. The desired CD for implant for the 45-nm node is about 150 nm, and the desired CD for the 32- and 22-nm nodes for implant is about 130 nm.

While the bottom anti-reflective coatings being used for most present-day applications are plasma-developed (dry), the less-used developer-soluble (wet) bottom anti-reflective coatings offer certain advantages, including eliminating the reactive ion etching (RIE) step necessary for dry development, as well as the potential damage to plasma-sensitive layers in the stack. The exposed resist and developer-soluble bottom anti-reflective coating are removed in the same step using a photoresist developer (e.g., aqueous tetramethylammonium hydroxide (TMAH)). These developer-soluble anti-reflective coatings increase the etch budget by minimizing the removal of non-exposed resist during the bottom anti-reflective coating development step. However, developer-soluble bottom anti-reflective coatings do not always provide the resolution achievable with dry bottom anti-reflective coatings and are typically aimed at noncritical applications such as implant layers, where resolution requirements are not as severe.

Many different chemical platforms for preparing light-sensitive, positive-working, developer-soluble bottom anti-reflective coatings have been described before. These bottom anti-reflective coatings are usually thermosetting and include: a) a dye-filled bottom anti-reflective coating using a polymeric binder; b) a coating formed using acid-degradable hyperbranched polymers with polymer-bound chromophores; or c) a coating formed using dye-attached linear polymers. For these three highlighted approaches, the polymer films become solvent insoluble (crosslinked) during a hot plate bake step. Upon exposure to an appropriate light source and a subsequent post-exposure bake (PEB), they degrade to developer- or water-soluble materials. Nevertheless, the need still remains for bottom anti-reflective coating platforms with improved resolution and processing latitudes needed for critical microlithography applications.

SUMMARY OF THE INVENTION

The present invention is broadly concerned with a method of forming a microelectronic structure. The method comprises providing a substrate having a surface, forming an anti-reflective layer on the substrate surface, and applying a photoresist to the anti-reflective layer to form an imaging layer. The anti-reflective layer is formed from an anti-reflective composition comprising a crosslinkable polymer dissolved or dispersed in a solvent system. The polymer comprises recurring monomeric units having adamantyl groups.

The present invention is also concerned with a microelectronic structure comprising a substrate having a surface, a cured anti-reflective layer adjacent said substrate surface, and a photoresist layer adjacent said anti-reflective layer. The anti-reflective layer is formed from an anti-reflective coating composition comprising a crosslinkable polymer dissolved or dispersed in a solvent system. The polymer comprises recurring monomeric units having adamantyl groups.

An anti-reflective coating composition comprising a crosslinkable polymer and a crosslinking agent dissolved or dispersed in a solvent system is also provided. The polymer comprises recurring monomeric units having adamantyl groups and recurring monomeric units having acid groups.

DETAILED DESCRIPTION OF THE INVENTION

Figure 1:
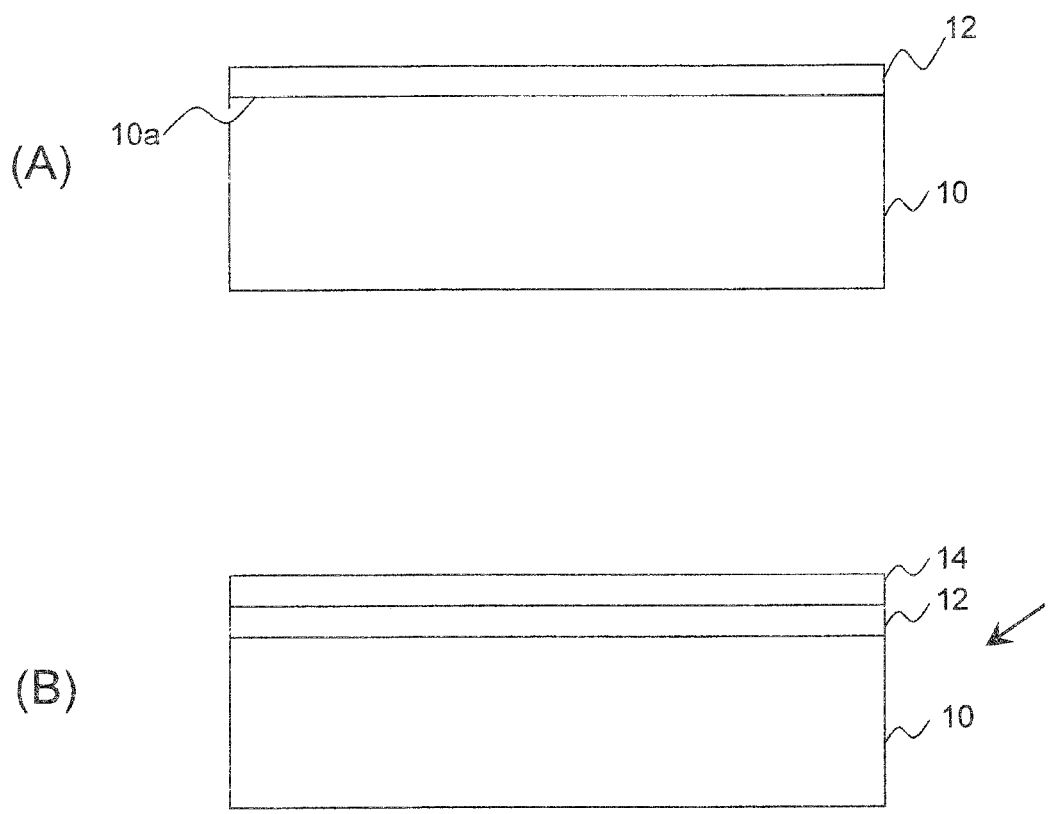
FIG. 1 is a schematic drawing depicting a structure (not to scale) formed by the inventive compositions and process.
Figure 1:
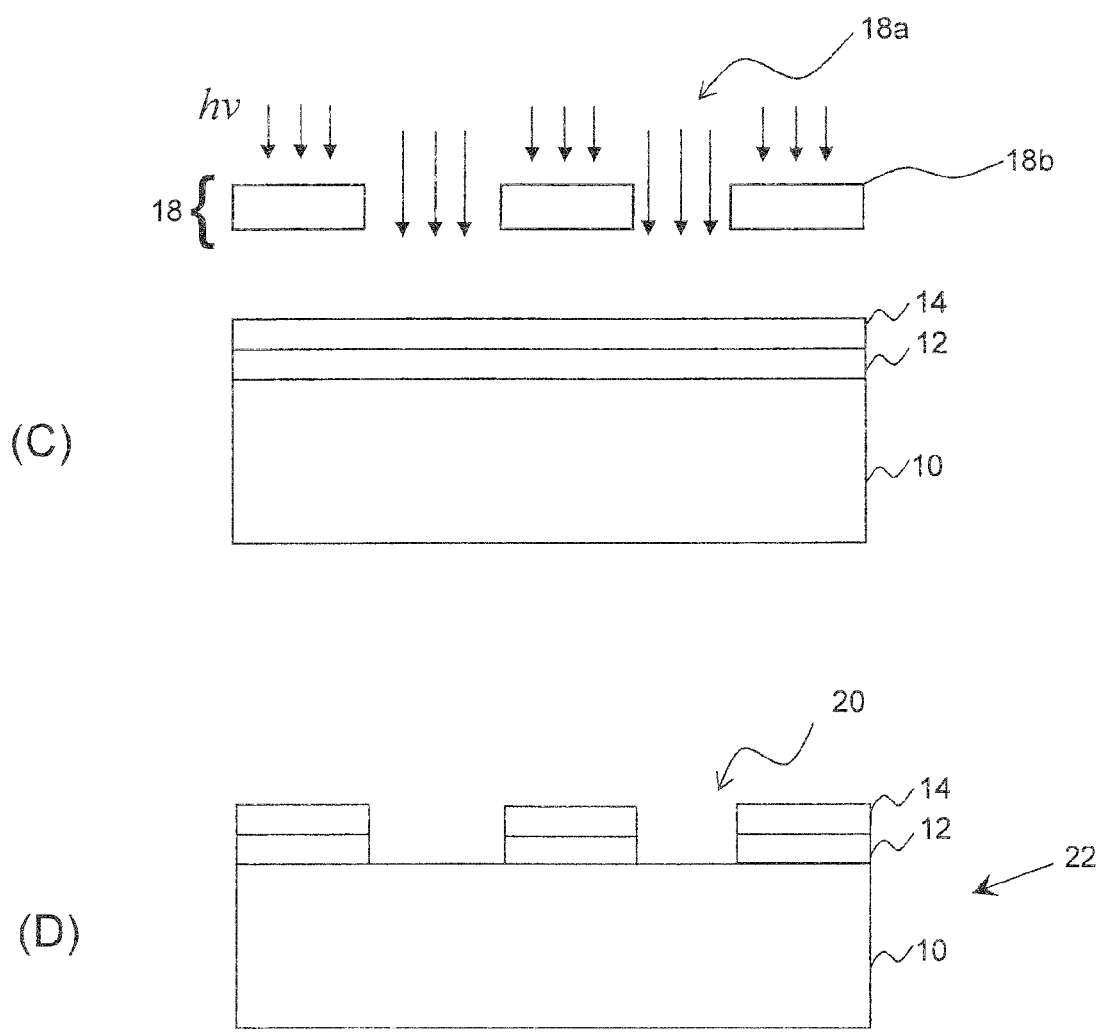

The present invention is concerned with new bottom anti-reflective coating compositions, methods of using these compositions, and structures formed thereof. The compositions when cured are preferably insoluble in both organic solvents and photoresist developers, but can be decrosslinked in the presence of an acid and removed with developer. In some aspects, the cured (i.e., crosslinked) anti-reflective coating composition is decrosslinked upon exposure to radiation, followed by a PEB. That is, the composition is photosensitive. In other aspects, the composition is not intrinsically photosensitive, but relies on acid diffusing from another layer (such as a photoresist) during exposure to decrosslink the cured composition. In either case, this results in exposed and unexposed portions of the anti-reflective coating having different dissolution rates, allowing the exposed portions to be removed without removing the unexposed portions. Thus, in both aspects, the inventive bottom anti-reflective coating compositions are wet developable. The terms "developer soluble" or "wet developable" as used herein mean the composition is capable of being rendered soluble in base developer or water upon decrosslinking so that it can be substantially removed with conventional aqueous developers or water as described herein.

The compositions preferably comprise a crosslinkable polymer (polymer binder), and more preferably a thermally crosslinkable polymer, dissolved or dispersed in a solvent system. The compositions also preferably comprise a crosslinker (referred to interchangeably with crosslinking agent) dispersed or dissolved in the solvent system with the polymer, in some embodiments, the composition can also comprise a photoacid generator (PAG) and/or a quencher.

The polymer preferably comprises recurring monomeric units having adamantyl groups. The adamantyl groups can be part of the polymer backbone, or they can be pendant adamantyl groups. In one embodiment, the adamantyl groups are preferably bonded to the polymer backbone via a linking group (such as an ester, or ether, etc.). The adamantyl groups are preferably acid-labile (cleavable). As used herein, the terms "acid-labile" or "acid-cleavable" adamantyl means an adamantyl group having a substitution (e.g., methyl, ethyl, isopropyl, or cyanomethyl) at the carbon (α-carbon) attached to the oxygen on the linking group to the polymer. The recurring monomeric units having adamantyl groups preferably do not participate in crosslinking of the polymer during thermal crosslinking. The adamantyl groups themselves also preferably do not contain any acid groups (e.g., there are no —OH groups). Particularly preferred adamantyl monomers for use in forming the polymer include adamantyl acrylates and methacrylates, with adamantyl methacrylates being particularly preferred and being selected from the group consisting of 2-isopropyl-2-adamantyl methacrylate (IPM), 2-ethyl-2-adamantyl methacrylate (EM), (2-adamantyloxy)methyl methacrylate (AM), 2-(cyanomethyl)-2-adamantyl methacrylate (CAM), and 2-[(2-methyl-adamantyl)-oxy]-carbonylmethyl methacrylate (MACM). The adamantyl monomers are preferably present in the polymer at a level of at least about 10% by weight, more preferably from about 10% to about 60% by weight, and even more preferably from about 15% to about 55% by weight, based upon the total weight of the polymer taken as 100% by weight.

Preferred polymers will also comprise recurring monomeric units having an acid functional group (i.e., have pendant acidic functionality). Preferred acid groups are selected from the group consisting of hydroxyl groups (—OH), carboxyl groups (—COOH), phenolics (—Ar—OH), fluoroalcohols (—C(CF$_3$)$_2$OH), and mixtures thereof. As noted above, the pendant adamantyl groups are preferably non-acid containing. Likewise, in the present invention, the recurring monomeric units having acidic functionality are preferably non-adamantyl-based monomers (i.e., free of adamantyls). The acid group is preferably present in the polymer at a level of at least about 3% by weight, preferably from about 4% to about 30% by weight, and even more preferably from about 5% to about 25% by weight, based upon the total weight of the polymer taken as 100% by weight. Unlike prior art compositions, the acid group, which serves as the crosslinking site (or crosslinkable moiety), is preferably not protected by a protective group. That is, at least about 95%, preferably at least about 98%, and preferably about 100% of the acid groups are free of protective groups. A protective group is a group that prevents the acid group from being reactive.

Thus, particularly preferred polymers will comprise recurring monomeric units of

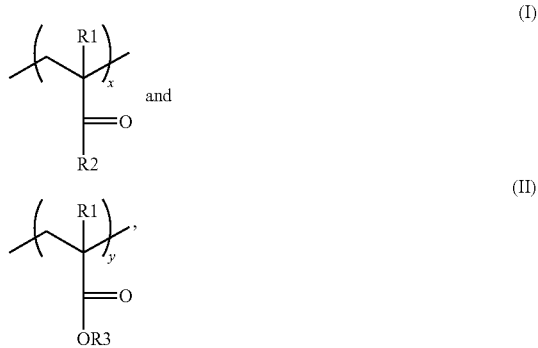

where each R1 is selected from the group consisting of —H, branched and unbranched alkyls (preferably $C_1$-$C_6$ alkyls, more preferably $C_1$-$C_4$ alkyls), and cyclics (including heterocyclics; preferably 3-12 ring members, more preferably 4-8 ring members); each R2 is individually selected from the group consisting of —OH, -L-OH, —COOH, -L-COOH, and -L-C(CF$_3$)$_2$OH, where L can be any suitable linking group (such as branched and unbranched alkyls ($C_1$-$C_{100}$, preferably $C_1$-$C_{20}$, and more preferably $C_1$-$C_6$), aromatics (—Ar), or amides); and each R3 is individually selected from the group consisting of

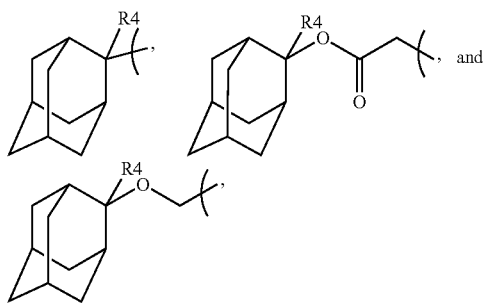

where each R4 is individually selected from the group consisting of branched and unbranched alkyls ($C_1$-$C_4$ alkyls, and preferably $C_1$-$C_3$ alkyls), and cyanoalkyls. The percent molar ratio of x:y in the polymer is preferably from about 90:10 to about 30:70, and more preferably from about 85:15 to about 60:40.

Alternatively, instead of, or in addition to the recurring monomeric units having pendant adamantyl groups, an acid-labile adamantyl group could be incorporated into the polymer backbone, as noted above. Via alternative polymerization techniques, one skilled in the art could include a group in the polymer such as

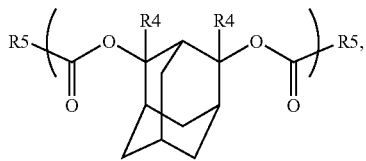

where each R4 is defined as above, except that one of said R4 groups can also be —H, and where each R5 group contains a polymerizable function. Additionally, different monomers could be selected that display different levels of acid-labile sensitivity.

A dye (e.g., light attenuating moiety or compound or chromophore) can also be included in the composition. The dye can simply be physically mixed into the anti-reflective composition, such as by dissolving or dispersing the dye in the solvent system with the polymer. When the dye is physically mixed into the composition suitable dyes include small molecules, and oligomeric or polymeric chromophores (e.g., poly (hydroxystyrenes) such as branched poly(4-hydroxystyrene), poly(vinylbenzoic acids); 3,7-dihydroxy 2-naphthoic acid; 3,7-dihydroxy 2-naphthoic acid-attached tris(2,3-expoxy propyl) isocyanate (TEPIC); styrene-maleic anhydride copolymer, 9-anthracene carboxylic acid: hydroxy-benzoic acid-attached TEPIC: cyanobenzoic acid-attached TEPIC: and mixtures thereof).

More preferably, the dye is bonded either to a functional group of the polymer, or event more preferably, attached directly to the polymer backbone (i.e., from its own monomeric repeat unit). The dye can also be built into the polymer backbone (i.e., as part of the above monomeric units or as an additional monomeric unit itself). Suitable dyes for use in the anti-reflective coating composition are preferably selected from the group consisting of styrenes, phenyls, naphthalenes, anthracenes, derivatives thereof, and combinations thereof. For dye attached embodiments, the dye is preferably present in the polymer at a level of at least about 15% by weight, preferably from about 18% to about 65% by weight, and even more preferably from about 20% to about 55% by weight, based upon the total weight of the polymer taken as 100% by weight.

In more detail, the polymer is preferably formed from the polymerization of a first compound selected from the group consisting of adamantyl acrylates and adamantyl methacrylates with at least a second compound, such as those selected from the group consisting of styrenics, acrylics, methacrylics, vinylics, vinyl ethers, derivatives thereof, and combinations thereof.

Additional monomers that can be incorporated into the polymer can include pendant polycyclic aromatic function in addition to crosslinking sites, or any potential acid crosslinking groups, or other groups that would change the polarity or hydrophobicity of the polymer, and can be used to modify the crosslinking density, hydrophobicity, or polarity of the anti-reflective film thereby making a film that is more difficult to de-crosslink, and/or rendering it more hydrophobic and less susceptible to developer in the unexposed areas. Suitable monomers are selected from the group consisting of 2-naphthoic acid-3-methacrylate (NAMA), mono-2-(methacryloyloxy)ethylsuccinate, fluorinated alcohol methacrylate, and t-Boc-oxystyrene (tBSM). When present, such monomers are preferably present in the polymer at a level of from about 0.5% to about 50% by weight, more preferably from about 2% to about 22% by weight, even more preferably from about 3% to about 20% by weight, and most preferably from about 4% to about 15% by weight, based upon the total weight of the polymer taken as 100% by weight.

In a further embodiment, a particularly preferred polymer for use in the invention consists essentially of recurring first monomeric units having adamantyl groups, recurring second monomeric units having acid groups, and recurring third monomeric units having a dye.

Regardless of the embodiment, the polymer is present in the anti-reflective composition at a level of up to about 10% by weight, preferably from about 0.06% to about 3 by weight, more preferably from about 0.7% to about 3.2% by weight, and even more preferably from about 0.8% to about 3% by weight, based upon the total weight of the anti-reflective composition taken as 100% by weight. The polymer also preferably has a weight average molecular weight ($M_w$) of up to about 100,000 g/mol, more preferably from about 2.500 g/mol to about 70,000 g/mol, and even more preferably from about 4,000 g/mol to about 60,000 g/mol.

As noted above, the composition also preferably comprises a crosslinking agent. Preferred crosslinking agents are vinyl ether crosslinkers. It is particularly preferred that the crosslinkers be multifunctional (di-, tri-, and tetra-functional). An example of commercially-available vinyl ethers include those sold under the trade name VECTomer™ (Aldrich; St. Louis, Mo.). Suitable vinyl ether crosslinkers can also be prepared as described herein. The crosslinker is preferably present in the composition at a level of from about 0.15% to about 1.08% by weight, preferably from about 0.2% to about 0.9% by weight, and even more preferably from about 0.22% to about 0.8% by weight, based upon the total weight of the composition taken as 100% by weight.

More preferably, the vinyl ether crosslinkers, when present, have the formula $$R'-(X-O-CH=CH_2)_n,$$

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of about 0.005% to about 0.08% by weight, preferably from about 0.008% to about 0.07% by weight, and more preferably from about 0.01% to about 0.06% by weight, based upon the total weight of the composition taken as 100% by weight.

In some embodiments, the anti-reflective compositions are preferably substantially free of acid generators (PAGs or thermal acid generators (TAGs)) and are thus, non-photosensitive, that is, the anti-reflective coating compositions preferably comprise less than about 0.01% by weight acid generator, more preferably less than about 0.005% by weight acid generator, and more preferably about 0% by weight of acid generator. In such embodiments, as noted above, the anti-reflective coating relies on acid diffusion from other layers in the stack to initiate the decrosslinking reaction to render the composition developer-soluble.

Preferred quenchers for use in the composition are preferably small molecules such as amines or polymers with base functionalities as part of the backbone or pendant moieties.

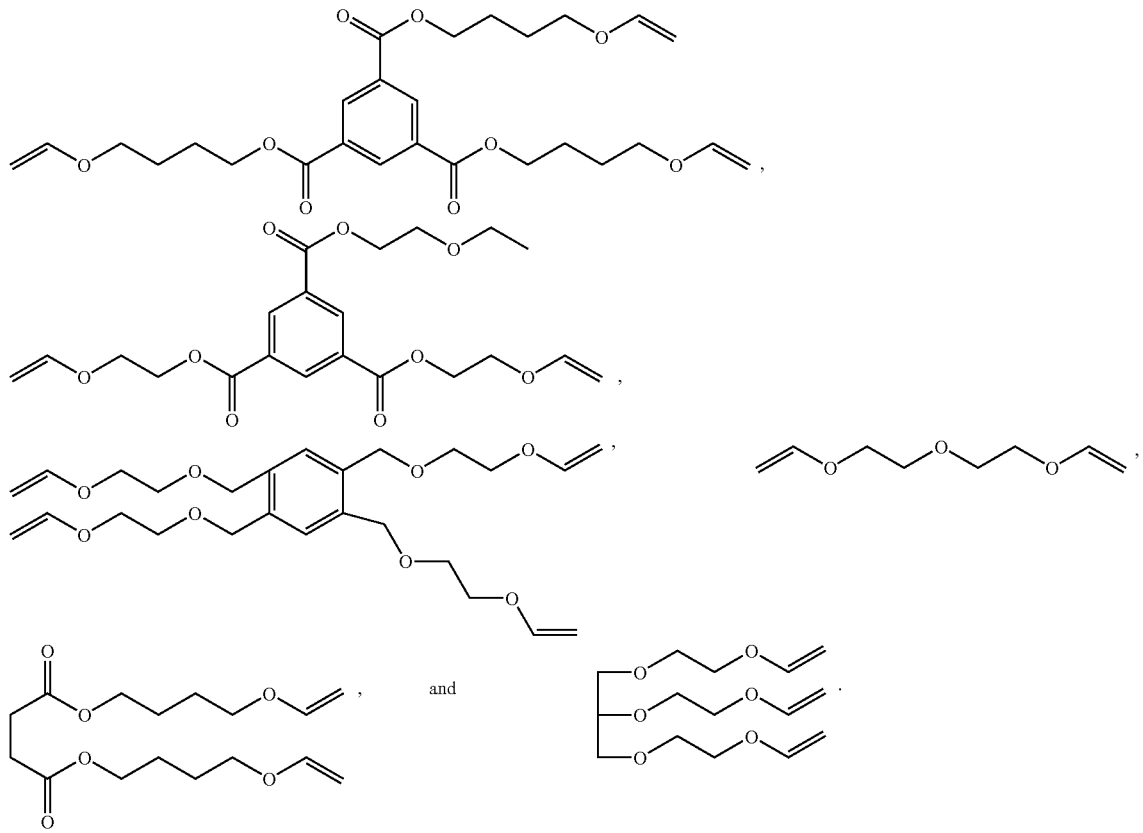

Preferred PAGs for use in the anti-reflective compositions are selected from the group consisting of: onium salts (e.g., triphenyl sulfonium perfluorosulfonates such as TPS nonaflate, TPS triflate, TPS tosylate, and substituted forms thereof such as tris(4-tert-butylphenyl)sulfonium perfluoro-1-butanesulfonate (an alkyl-substituted TPS nonaflate), all available from Sigma-Aldrich); oxime-sulfonates (e.g., those sold under the name CGI® by CIBA) triazines (e.g., TAZ108® available from Midori Kagaku Company): succinimidyl based-sulfonates (Midori Kagaku Cunompany); naphthalimidyl-based sulfonates (Midori Kagaku Company), Iodonium salts and combinations thereof. When present, the PAG should be present in the compositions at a level of from Suitable quenchers include those selected from the group consisting of 1-Boc-4-hydroxypiperidine, triethanolamine, triethylamine, trim ethanol amine, trimethylamine, triisopropanolamine, triisopropylamine, tri-t-butanolamine, tri-t-butylamine, tri-n-butanolamine, tri-n-butylamine, diethanolamine, diethylamine, dimethanolamine, dimethylamine, diisopropanolamine, diisopropylamine, di-t-butanolamine, di-t-butylamine, di-n-butanolamine, di-n-butylamine, ethanolamine, ethylamine, methanolamine, methylamine, isopropanolamine, isopropylamine, t-butanolamine, t-butylamine, n-butanolamine, and n-butylamine, t-Boc-oxystyrene/4-vinyl pyridine copolymer, any polymer using 4-vinyl pyridine as a monomer, and combinations thereof.

When present, the anti-reflective coating compositions will preferably comprise less than about 0.05% by weight quencher, more preferably from about 0.0002% to about 0.02% by weight quencher, more preferably from about 0.00025% to about 0.018% by weight, an even more preferably from about 0.0003% to about 0.017% by weight, based upon the total weight of composition taken as 100% by weight. The anti-reflective coating compositions can also be substantially free of quenchers, in such embodiments, the composition preferably comprises less than about 0.0001% by weight quencher, more preferably less than about 0.00005% by weight quencher, and even more preferably about 0% by weight quencher.

Additional ingredients that may be optionally included in the composition include surfactants, adhesion promoters, antioxidants, photoinitiators, diffusion promotors, dissolution inhibitors, and combinations of the foregoing.

Regardless of the embodiment, the anti-reflective coating compositions are formed by simply dispersing or dissolving the polymer in a suitable solvent system, preferably at ambient conditions, and for a sufficient amount of time to form a substantially homogeneous solution. Any additional ingredients are also preferably dispersed in the solvent system along with the polymer.

Preferred solvent systems include a solvent selected from the group consisting of ethyl lactate (EL), propylene glycol methyl ether acetate (PGMEA), propylene glycol methyl ether (PGME), propylene glycol n-propyl ether (PnP), cyclohexanone, gamma-butyrolactene, and mixtures thereof. Preferably, the solvent system has a boiling point of from about 118° C. to about 160° C., and more preferably from about 118° C. to about 146° C. The solvent system should be utilized at a level of at least about 90% by weight, preferably from about 96.5% to about 99.4% by weight, more preferably from about 96.9% to about 99.2% by weight, and even more preferably from about 97.5% to about 99% by weight, based upon the total weight of the composition taken as 100% by weight. The composition will preferably comprise a solids content of from about 0.6% to about 3.5% by weight, preferably from about 0.8% to about 3.1% by weight, and even more preferably from about 1% to about 2.5% by weight, based upon the total weight of the composition taken as 100% by weight.

FIGS. 1(A)-1(D) illustrate a method of forming a structure using the inventive anti-reflective coatings of the invention. In the method, a substrate 10 having a surface 10a is provided. Any microelectronic substrate can be used in the invention. Preferred substrates include those selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, ion implant layers, titanium nitride, hafnium oxide, silicon oxynitride, and mixtures of the foregoing. The method comprises applying a quantity of the inventive anti-reflective composition to the substrate 10 to form a layer 12 of the composition on the surface 10a of the substrate 10. The composition can be applied by any known application method, with one preferred method being spin-coating the composition at speeds of from about 750 rpm about 750 rpm to about 5,000 rpm (preferably from about from about 750 rpm to about 4,000 rpm, and more preferably from about 1,000 rpm to about 3,500 rpm) for a time period of from about 20 seconds to about 90 seconds (preferably from about 30 seconds to about 60 seconds). The substrate 10 can have a planar surface, or it can include topography features (via holes, trenches, contact holes, raised features, lines, etc.). As used herein. "topography" refers to the height or depth of a structure in or on a substrate surface. For example, the substrate 10 can comprise structure defining a hole, which includes sidewalls and a bottom wall. Thus, the method of applying the anti-reflective composition to the substrate would preferably include applying the composition to at least a portion of those hole sidewalls and bottom wall.

After the desired coverage is achieved, the composition layer 12 is then baked to induce thermal crosslinking of the composition to form a cured layer 12. Preferred baking conditions involve temperatures of at least about 125° C., preferably from about 150° C. to about 230° C., and more preferably from about 150° C. to about 205° C., and even more preferably from about 155° C. to about 180° C., and for a time period of from about 30 seconds to about 90 seconds (preferably from about 45 seconds to about 75 seconds). The thickness of the anti-reflective coating layer 12 after baking is preferably from about 20 nm to about 85 nm, more preferably from about 30 nm to about 75 nm, even more preferably from about 32 nm to about 70 nm, and most preferably from about 33 nm to about 65 nm. If the substrate surface 10a includes topography, the anti-reflective coating 12 is preferably applied at a thickness sufficient to substantially cover the substrate topography at these thicknesses.

In embodiments where the polymer acid group is a carboxylic acid group, and the crosslinker is a vinyl ether crosslinker, the crosslinked polymers will comprise acetal linkages having the formula

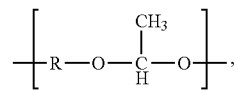

where R is selected from the group consisting of aryls (preferably from about $C_6$ to about $C_{12}$), —CO—, and branched and unbranched alkyls. As noted above, the recurring monomeric units having adamantyl groups preferably do not participate in crosslinking.

The crosslinked layer 12 will be sufficiently crosslinked that it will be substantially insoluble in typical photoresist solvents. Thus, when subjected to a stripping test, the inventive coating layers will have a percent stripping of less than about 5%, preferably less than about 1%, and even more preferably about 0%. The stripping test involves first determining the thickness (by taking the average of measurements at five different locations) of a cured layer. This is the average initial film thickness. Next, ethyl lactate (EL) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This is the average final film thickness. The amount of stripping is the difference between the initial and final average film thicknesses. The percent stripping is:

$$\% \text{ stripping} = \left(\frac{\text{amount of stripping}}{\text{initial average film thickness}}\right) \times 100.$$

The crosslinked layer 12 is also preferably substantially insoluble in typical photoresist developers as described herein. The solubility of the crosslinked anti-reflective film in developer is evaluated using the same procedure and calculation as that for the stripping test described above, except that instead of a photoresist solvent (EL), a developer is used. The crosslinked layer is also subjected to a PEB at 110° C. for 60 seconds. Next. 0.26 N TMAH developer is puddled onto the layer for 45 seconds, followed by a 5-second deionized water rinse, and a spin dry. Any loss of thickness in the cured layer is defined as the "dark loss." The cured layer will have a dark loss of less than about 5%, preferably less than about 1.5%, more preferably less than about 1%, even more preferably less than about 0.8%, and most preferably about 0%.

The wet development of the film can also be evaluated using a similar procedure and calculation as that for the stripping test. The cured layer is first exposed at 20 mJ/cm² with broadband light on an Oriel™ DUV broadband exposure unit. The exposed layer is then subjected to a PEB at 130° C. for 90 seconds. A photoresist developer (0.26 N TMAH) is then puddled onto the film for 60 seconds, followed by a 5-second deionized water rinse while spinning at 300 rpm, and then spin drying at about 3,000 rpm for about 30 seconds to remove the developer. The thickness of the layer is measured again, and the % development is calculated. The photosensitive anti-reflective coating will preferably have a % development of from about 95% to about 100%, and more preferably from about 99% to about 100%. In embodiments where the anti-reflective coating composition is non-photosensitive, the % wet development will preferably be less than about 1.5%, preferably less than about 0.8%, and even more preferably about 0%.

The refractive index (n value) of the cured anti-reflective layer or coating 12 will be at least about 1.3, preferably from about 1.4 to about 2, more preferably from about 1.45 to about 1.8, and even more preferably from about 1.5 to about 1.75. The anti-reflective coating layer 12 also preferably has an extinction coefficient (k value) of at least about 0.2, preferably from about 0.25 to about 0.65, and more preferably from about 0.3 to about 0.6, at the wavelength of use (e.g., 193 nm, 248 nm, or 365 nm).

Referring to FIG. 1(B), a photoresist composition can then be applied to the cured layer 12 to form an imaging layer 14, resulting in stack 16. The imaging layer 14 is then preferably post-application baked (PAB) at a temperature of at least about 95° C., preferably from about 100° C. to about 135° C., and more preferably from about 100° C. to about 130° C., for time periods of from about 45 seconds to about 75 seconds. It will be appreciated that the thickness of the imaging layer 14 can range from about 50 nm to about 2,000 nm. Preferably, the thickness of the imaging layer 14 is from about 100 nm to about 250 nm, more preferably from about 120 nm to about 240 nm, even more preferably from about 130 nm to about 230, and most preferably from about 170 to about 225 nm. Suitable imaging compositions include commercially-available photoresists (e.g., TarF-Pi6-001 from TOK, Kawasaki shi, Kanagawa (Japan); ARX3001JN, ARX3340J, and AM2073J, from JSR Micro, Sunnyvale, Calif.: SAIL-X-181, Shin-Etsu, Tokyo (Japan)), or any other photosensitive compositions. Where the anti-reflective coating composition is not intrinsically photosensitive (i.e., a PAG-less anti-reflective coating), suitable photoresist compositions will preferably comprise an acid generator (preferably a PAG) and be capable of generating sufficient acid for decrosslinking and deprotecting the adjacent anti-reflective coating to render it developer-soluble, as explained in more detail below.

The imaging layer 14 can be patterned by exposure to light of the appropriate wavelength, followed by development of the exposed photoresist. More specifically, referring to FIG. 1(C), the imaging layer 14 is exposed using a mask 18 positioned above the surface of the imaging layer 14. The mask 18 has open areas 18a designed to permit radiation (hv) to pass through the mask 18 and contact the imaging layer 14. The remaining solid portions 18b of the mask 18 are designed to prevent radiation from contacting the surface of imaging layer 14 in certain areas. Those skilled in the art will readily understand that the arrangement of open areas 10a and solid portions 10b is designed based upon the desired pattern to be formed in the imaging layer 14 and ultimately in the substrate 10.

Advantageously, as the imaging layer 14 is exposed to radiation (i.e., light), so is the inventive anti-reflective coating layer 12. Upon exposure to light, an acid is generated from the PAG (either in the anti-reflective coating itself or from the photoresist composition), and this acid "decrosslinks" the polymer in the anti-reflective coating layer 12. That is, even where the anti-reflective coating is not intrinsically photosensitive, the exposed portions of the anti-reflective coating layer 12 are still rendered developer-soluble upon exposure to light by acid diffusing from the exposed portions of the imaging layer 14 into the corresponding portions of the anti-reflective layer 12 adjacent the imaging layer 14. The acid (whether from the photoresist or anti-reflective coating) breaks the bond that was formed between the polymer and the crosslinker in the anti-reflective coating upon thermal crosslinking. For example, when a carboxylic acid is the acid group on the polymer, decrosslinking results in the breaking of the bond (*) of the linkage having the formula

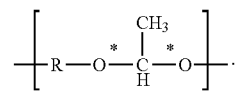

The acid also preferably cleaves the acid-labile adamantyl group, further enhancing the solubility of the polymer. The exposed portions of the anti-reflective layer 12 thus comprise free adamantyls, which are removed during development. After exposure, the imaging layer 14 and anti-reflective coating layer 12 are preferably subjected to a PEB at a temperature of from about 85° C. to about 140° C. more preferably from about 95° C. to about 135° C., and more preferably from about 105° C. to about 130° C., for a time period of from about 45 seconds to about 75 seconds.

The exposed portions of the imaging layer 14 and anti-reflective coating layer 12 which were made soluble by the above process, are then contacted with a photoresist developer to remove the exposed portions. The exposed portions of the anti-reflective coating layer 12 underneath the exposed portions of the imaging layer 14 are removed by the developer as the imaging layer 14 is removed so as to simultaneously form the desired pattern 20 in the imaging layer 14 and anti-reflective coating layer 12. The pattern 20 can be via holes, trenches, lines, spaces, etc., that will ultimately be transferred to the substrate 10 using an etch or ion implantation process. Preferably, at least about 95% of the exposed portions of the imaging layer 14 and anti-reflective coating layer 12 will be removed by the developer, more preferably at least about 99%, and even more preferably about 100% will be removed.

Suitable developers are organic or inorganic alkaline solutions such as potassium hydroxide (KOH), TMAH, and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

In another embodiment, ArF immersion lithography (not shown) can be used to pattern the photoresist. Instead of air (as in conventional lithography), the medium through which the radiation passes during exposure is a liquid. The imaging layer is exposed to radiation via an optical projection element (i.e., lens) of a lithographic system, with the immersion liquid contacting at least a portion of the optical element of the lithographic system and a portion of the structure (i.e., the stack). Even more preferably, the liquid fills the space between the last optical element in the system and the imaging layer, such that the optical element is immersed in the liquid. Suitable immersion liquids preferably have a refractive index greater of than 1 (preferably from about 1 to about 2, and more preferably from about 1.3 to about 1.4), and are selected from the group consisting of water (preferably purified water) or organic solvents. Immersion lithography systems are known in the art and include the Amphibian Inerferometer from Amphibian™ Systems (Rochester, N.Y.), and the 1900i from ASML (Veldhoven, Netherlands).

Regardless of the embodiment, conventional etching, metallization, etc., can then be carried out on the patterned stack 22 to complete the device manufacture. The exposure-development process can also be repeated using a second imaging layer applied adjacent to the patterned anti-reflective coating if a multiple exposure process is desired.

EXAMPLES

The following examples set forth methods in accordance with the invention. It is to be understood, however, that these examples are provided by way of illustration and nothing therein should be taken as a limitation upon the overall scope of the invention.

Example 1

Terpolymer I Synthesis and Precipitation Thereof

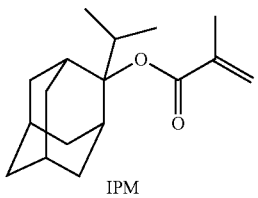 [SMILES: C=C(C)C(=O)OC1(C(C)C)C2CC3CC(C2)CC1C3]

IPM

In this procedure, a terpolymer was synthesized using 12.9 mol % IPM, methacrylic acid, and styrene, followed by precipitation. A 500-ml three-necked flask equipped with magnetic stirring bar and thermometer was charged with 9.08 g (105.5 mmol) of methacrylic acid (Sigma-Aldrich, St. Louis, Mo.), 12.38 g (118.9 mmol) of styrene (Sigma-Aldrich. St. Louis, Mo.), 8.71 g ((33.2 mmol) of Adamantate® X-M-105 (IPM; Idemitsu Kosan Co., Ltd., Tokyo, Japan), and 203.72 g of PGME. The mixture was stirred for 5 minutes at room temperature to produce a solution. A dropping funnel with a nitrogen inlet adapter and a condenser with a nitrogen outlet adapter were then attached to the flask.

A clear 125-ml Nalgene bottle was charged with 0.68 g (4.14 mmol) of 2,2'-azobisisobutyronitrile (AIBN; Sigma-Aldrich, St. Louis, Mo.) and 67.63 g of PGME. The mixture was tumbled at room temperature for 0.64 hours to produce a solution. The dropping funnel attached to the flask was charged with the AIBN solution, and the reaction system was then purged with nitrogen at room temperature for 2.0 hours. Next, the flask was immersed in an oil bath at 102.5-103° C. The reaction mixture was stirred under nitrogen. With the reaction solution temperature at 103° C., the AIBN solution was gradually added to the reaction flask over a period of 3 minutes. The resulting reaction mixture was then stirred under nitrogen at 98°-105° C. for 24 hours. Yield: 299.5 g solution (99% recovery); 10.18 wt. % polymer solids. The terpolymer 1 $M_w$ in solution by gel permeation chromatography (GPC) was 15,150 g/mol, with a dispersity (D) of 2.8.

To precipitate terpolymer I from solution, a 4-liter beaker equipped with an overhead stirrer and stirring rod was charged with 2 liters of hexanes. A dropping funnel was charged with 200.7 g of the IPM terpolymer solution, which was then added dropwise from the funnel to the stirred hexanes over 0.5 hour. The mixture was stirred at room temperature for an additional 5 minutes and was then allowed to settle. Solvent was removed by a vacuum filtration. The terpolymer solids were then stirred with 200 ml of fresh hexanes for 2 minutes, followed by solvent removal via vacuum filtration. The terpolymer solids were again stirred with 202 ml of fresh hexanes for 5 minutes, followed by solvent removal via vacuum filtration. The terpolymer solids were dried in a 40° C. vacuum oven, ground to a powder using a mortar and pestle, and dried to constant weight in a 40° C. vacuum oven. Yield: 12.6 g of powder (62% yield). The terpolymer $M_w$ via GPC was 16,050 g/mol, with a D of 2.1.

Example 2

Preparation of a Bottom Anti-Reflective Coating Using Terpolymer I

In this procedure, a bottom anti-reflective coating was prepared using terpolymer I (IPM), from Example 1 above, along with a PAG, and a quencher. A 250-ml amber Nalgene bottle was charged with 0.718 g of an in-house vinyl ether crosslinker (see Example 27), 2.423 g of terpolymer I, 156.1861 g of PGME, and 39.36 g of PGMEA. The mixture was tumbled at room temperature for 15.2 hours. Next, 1296 g of a 1% quencher (1-Boc-4-hydroxypiperidine; Sigma-Aldrich, St. Louis, Mo.) in PGME solution was added, followed by 0.0423 g of CGI TPS-Cl (Ciba, Tarrytown, N.Y.). The bottle was then tumbled at room temperature overnight, and its contents twice filtered through a 0.1-μm end-point filter into four 60-ml amber Nalgene bottles.

Various properties of the resulting bottom anti-reflective coating were then tested. For the optical and film property tests, the bottom anti-reflective coating was first spin applied to silicon wafers at 1,500 rpm for 30 or 60 seconds and thermoset (i.e., baked at 160° C. for 60 seconds). The initial thickness of the resulting film was measured and recorded using a Gaertner ellipsometer.

To test the solvent resistance of the layer, a photoresist solvent (ethyl lactate) was puddled onto the film for 20 seconds, followed by spin drying at about 3,000 rpm for about 30 seconds to remove the solvent. The thickness was measured again using the ellipsometer, and the % stripping or swelling was calculated, as described above.

The effects of a photoresist developer (0.26N aqueous TMAH) on unexposed (dark loss) coatings were also measured. To evaluate dark loss, another wafer was coated with the anti-reflective coating and baked as described above, and the initial thickness of the film was measured and recorded. The unexposed layer was subjected to a PEB at 110° C. for 60 seconds. A photoresist developer (0.26 N TMAH) was then puddled onto the film for 45 seconds, followed by a 5-second deionized water rinse, and a spin dry. The thickness of the layer was measured using the ellipsometer, and the dark loss was calculated. A positive number for the EL stripping test or the dark loss signifies swelling of the film.

The n and k values of the film were then measured at 193 nm using a J.A. Woollam Co., Inc. VASE® ellipsometer. Film and optical properties for this bottom anti-reflective coating are shown in Table 2 of the Examples 1-17 Results.

Figure 2A:
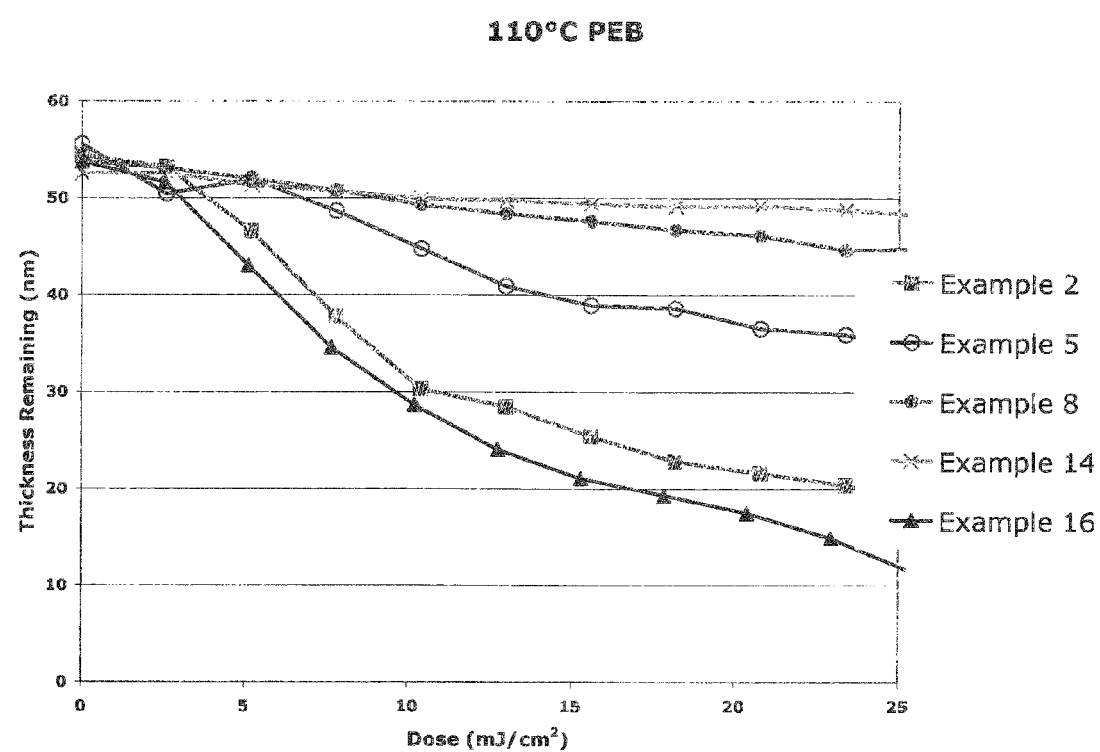
FIG. 2(a) shows a graph of contrast curves for various bottom anti-reflective coatings prepared for Examples 2, 5, 8, 14, and 16 of the working examples, exposed without a photoresist using a PEB of 110° C.
Figure 2B:
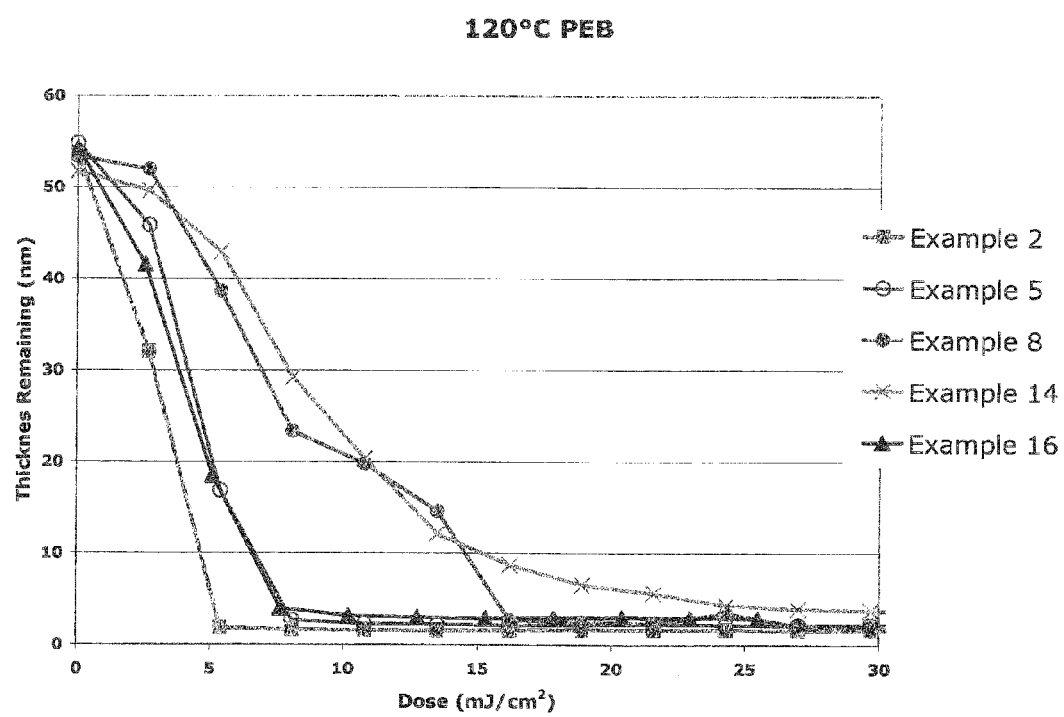
FIG. 2(b) shows a graph of contrast curves for various bottom anti-reflective coatings prepared for Examples 2, 5, 8, 14, and 16 of the working examples, exposed without a photoresist using a PEB of 120° C.
Figure 2C:
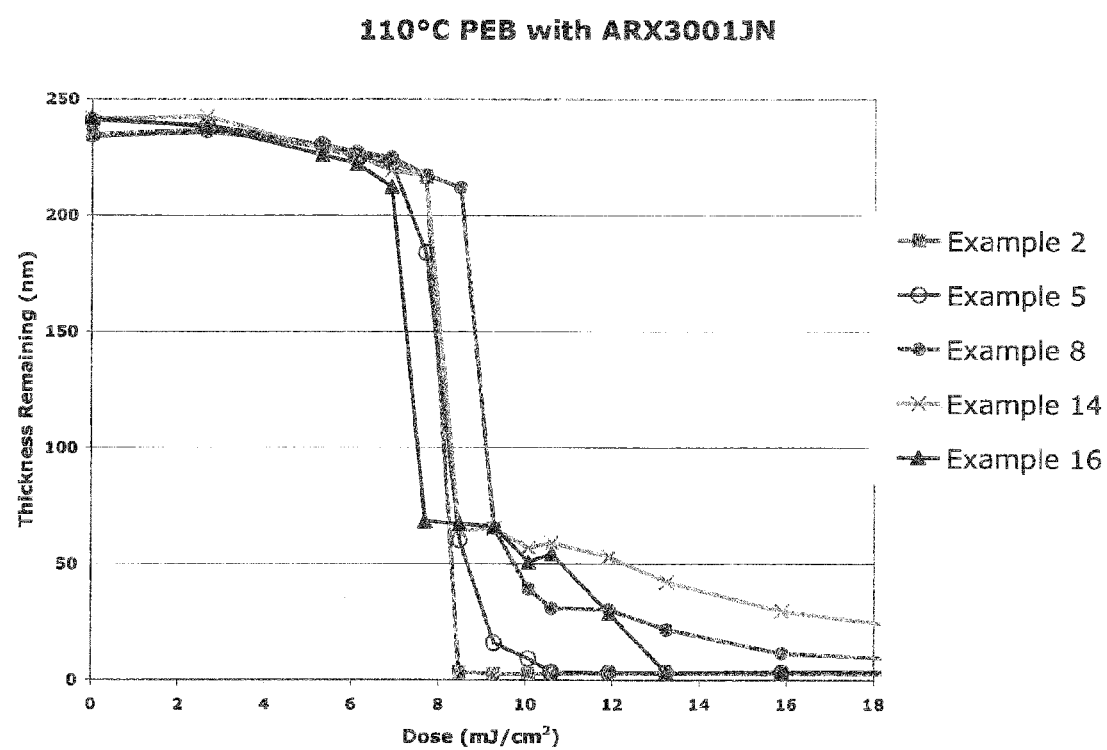
FIG. 2(c) shows a graph of contrast curves for various bottom anti-reflective coatings prepared for Examples 2, 5, 8, 14, and 16 of the working examples, exposed with a covering photoresist using a PEB of 110° C.

The contrast curve for this bottom anti-reflective coating was determined using an Oriel™ DUV exposure unit with the light passing through a 248-nm bandpass filter prior to the exposures. The bottom anti-reflective coating was spin applied to silicon wafers at 1.500 rpm for 30 or 60 seconds and baked at 160° C. for 60 seconds. Two wafers were exposed, followed by a PEB of either 100° C. for 60 seconds or 120° C. for 60 seconds. Secondly, a covering resist (ARX3001JN; JSR Micro) was applied at a 195-nm thickness, followed by a PAB of 110° C. for 60 seconds, exposure, and a PEB of 110° C. for 60 seconds. The contrast curve results for both PEBs with and without the resist are shown in FIGS. 2(a)-(c). This bottom anti-reflective coating gave the lowest EL of the bottom anti-reflective coatings shown in FIGS. 2(a)-(c).

Figure 3:
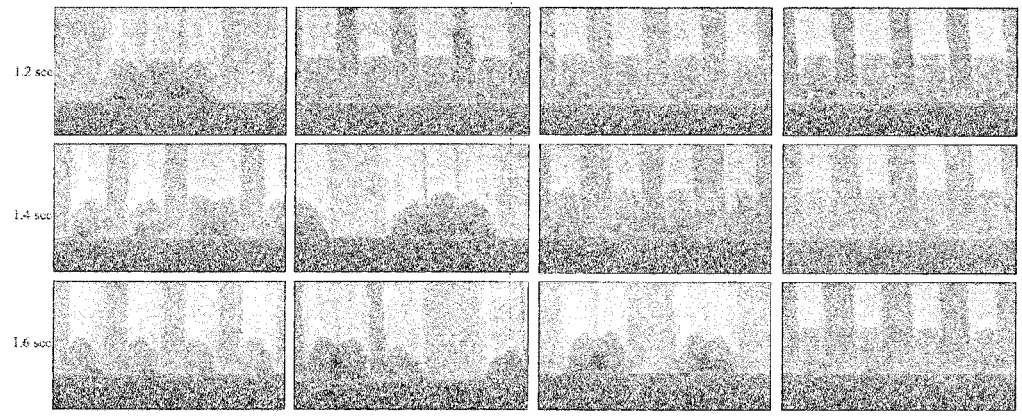
FIG. 3 are photographs of scanning electron microscope (SEM) cross-sections from 193-nm lithography carried out in Examples 2, 5, 8, and 14 using various bottom anti-reflective coatings at the indicated exposure times.

Next, 193-nm exposures for lithography using a covering resist (ARX3001JN) were carried out on an Amphibian XIS interferometer (Amphibian Systems) at various exposure times, as indicated in FIG. 3, with a PAB and PEB of 110° C. for 60 seconds. The 150-nm L/S (1:1) fell over.

Example 3

Preparation of a PAG-Less Bottom Anti-Reflective Coating Using Terpolymer I

Figure 4:
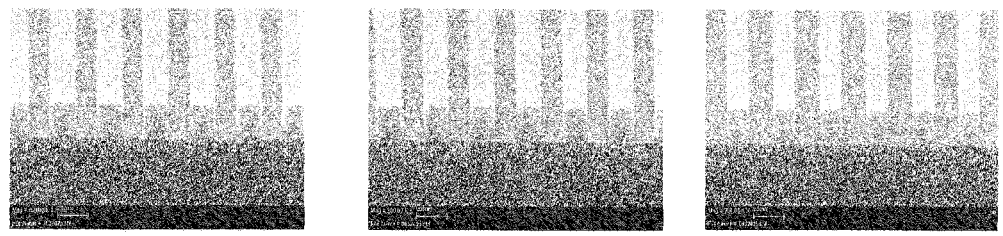
FIG. 4 depicts photographs of SEM cross-sections from 193-nm lithography carried out in Example 3 of: a) a 38-nm bottom anti-reflective coating at various exposure times; and b) a 54-55-nm bottom anti-reflective coating at various exposure times.
Figure 4:
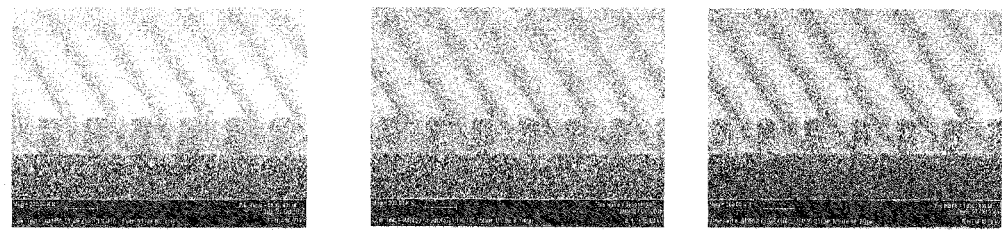

In this procedure, a bottom anti-reflective coating was prepared using terpolymer I (IPM), without a PAG or quencher. A 125-ml amber Nalgene bottle was charged with 1.2156 g of terpolymer I, 0.359 g of the crosslinker from Example 27, 74.309 g of PGME, and 19.679 g of PGMEA. The mixture was tumbled at room temperature overnight, and then endpoint filtered using a 0.1-μm filter. The resulting bottom anti-reflective coating was spin applied to a silicon wafer at either: a) 1,500 rpm for 30 or 60 seconds or b) 2,738 rpm for 30 or 60 seconds, each followed by baking at 160° C. for 60 seconds. Spin parameter a) gave 54-55 nm of thermoset bottom anti-reflective coating, while spin parameter b) gave 38 nm of thermoset bottom anti-reflective coating. Next, 193-nm lithography was carried out as described above in Example 2 using covering resist ARX3001JN at a 195-nm thickness. The SEM photos (prepared using a LEO 1560 from Carl Zeiss SMT Inc.) are shown in FIG. 4. For both thicknesses, very good 150-nm L/S (1:1) were obtained.

The film and optical properties for this bottom anti-reflective coating were then determined as described above in Example 2. The results are shown in Table 2.

Example 4

Synthesis of Terpolymer II and Precipitation Thereof

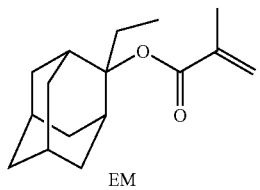 [SMILES: C=C(C)C(=O)OC1(CC)C2CC3CC(C2)CC1C3]

EM

In this procedure, a terpolymer was synthesized using 12.9 mol % EM, methacrylic acid, and styrene. A 500-ml three-necked flask equipped with magnetic stirring bar and thermometer was charged with 9.1 g (106 mmol) of methacrylic acid, 12.40 g (119.15 mmol) of styrene, 8.26 g (33.3 mmol) of Adamantate® EM (Idemitsu Kosan Co., Ltd., Tokyo, Japan), and 200.78 g of PGME. The mixture was stirred at room temperature for 6 minutes to provide a solution. A condenser with nitrogen outlet adaptor and dropping funnel with nitrogen inlet adaptor were attached to the flask.

Next, a 125-ml Nalgene bottle was charged with 0.654 g (3.98 mmol) of AIBN and 66.88 g of PGME. The mixture was tumbled at room temperature for 0.6 hours to produce a solution. The AIBN solution was then transferred to the dropping funnel. The reaction system was flushed with nitrogen for 15 minutes, and the flask was then immersed in an oil bath at 100° C. The mixture was stirred under nitrogen for 24 hours at 98°-104° C. Yield: 294.4 g of solution (99% recovery); 10.18 wt. % polymer solids. The terpolymer $M_w$ in solution via GPC was 15,250 g/mol, with a D of 2.5.

To precipitate terpolymer II from solution, a 4-liter beaker was charged with 2.00 liters of hexanes. A dropping funnel was charged with 199.8 g of the terpolymer II solution, which was then added dropwise to the stirred hexanes at room temperature over 13.2 minutes. The mixture was then stirred for an additional 6 minutes at room temperature. The solvent was removed by vacuum filtration. About 200 ml of fresh hexanes were added to the terpolymer as a rinse, with the mixture being stirred for another 6 minutes, followed by again removing the solvent via vacuum filtration. An additional 200 ml of fresh hexanes were added, and the mixture was stirred for 5 minutes. The solvent was again removed by a vacuum filtration. The terpolymer was dried to constant weight in a 40° C. vacuum oven. Yield: 14.0 g (69% recovery). The terpolymer $M_w$ via GPC was 16,850 g/mol, with a D of 2.1.

Example 5

Preparation of a Bottom Anti-Reflective Coating Using Terpolymer II

In this procedure, a bottom anti-reflective coating was prepared using terpolymer II (EM) from Example 4 above, a PAG and a quencher. A 250-ml Nalgene bottle was charged with 0.5353 g of the crosslinker from Example 27, 1.8215 g of terpolymer II, 117.1579 g of PGME, 29.5210 g of PGMEA, 0.9456 g of 1% quencher (1-Boc-4-hydroxypiperidine) in PGME, and 0.0316 g of TPS-Cl. The mixture was tumbled overnight and then filtered through a 0.1-m end-point filter.

The film and optical properties for the terpolymer II bottom anti-reflective coating were then determined as described above in Example 2. The results are shown in Table 2.

The contrast curve for the terpolymer II bottom anti-reflective coating was also determined as described above in Example 2, and is shown in FIG. 2. Next, 193-nm lithography was carried out as described above in Example 2. The SEM photos (prepared using a LEO 1560 from Carl Zeiss SMT Inc.) are shown in FIG. 3 for each exposure time. As seen in FIG. 3, at film thicknesses of 52-56 nm, 150-nm L/S (1:1) were obtained from a 1.2-second exposure.

Example 6

Preparation of PAG-Less Bottom Anti-Reflective Coating Using Terpolymer II

In this procedure, a bottom anti-reflective coating was prepared using terpolymer II (EM) from Example 4, without a PAG or quencher. A 250-ml amber Nalgene bottle was charged with 0.359 g of the crosslinker from Example 27, 78.715 g of PGME, 19.676 g of PGMEA, 1.214 g of terpolymer II. The mixture was tumbled at room temperature for greater than 3.5 hours. The coating was then filtered through a 0.1-μm endpoint filter.

Figure 5:
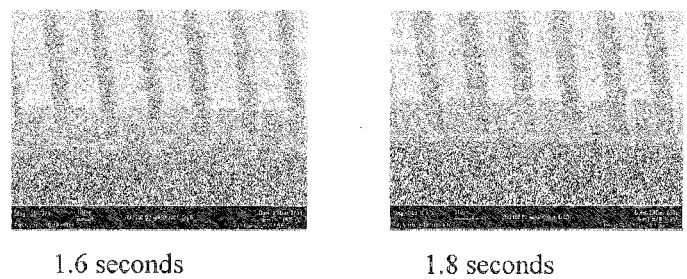
FIG. 5 shows photographs of SEM cross-sections from 193-nm lithography carried out using the bottom anti-reflective coating prepared in Example 6 at various exposure times.

The film and optical properties for this anti-reflective coating were determined, followed by 193-nm lithography, as described above. The film and optical properties for this bottom anti-reflective coating are shown in Table 2. The SEM photos are shown in FIG. 5.

Example 7

Terpolymer III Synthesis and Precipitation Thereof

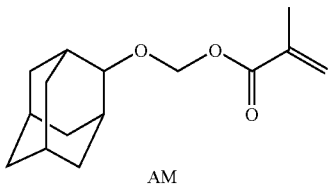 [SMILES: C=C(C)C(=O)OCOC1C2CC3CC(C2)CC1C3]

AM

In this procedure, a terpolymer was synthesized using 12.9 mol % AM, methacrylic acid, and styrene. A 500-ml three-necked flask equipped with magnetic stirring bar and thermometer was charged with 9.07 g (105.4 mmol) of methacrylic acid, 12.37 g (118.8 mmol) of styrene, 8.32 g (33.2 mmol) of Adamantate® M-101 (AM; Idemitsu Kosan Co., Ltd., Tokyo, Japan), and 200.94 g of PGME. The mixture was stirred at room temperature for about 3 minutes. A condenser with attached nitrogen outlet adapter and dropping funnel with attached nitrogen inlet adaptor were attached to the three-necked flask.

Next, a 60-ml Nalgene bottle was charged with 0.68 g (4.14 mmol) of AIBN and 54595 g of PGME. The mixture was tumbled for 2 hours at room temperature to produce a solution, and the solution was then added to the dropping funnel. About 12.11 g of PGME was added to the 60 ml Nalgene bottle to thoroughly rinse the interior of the bottle, and this rinse was also added to the dropping funnel. The reaction system was flushed with nitrogen for 15 minutes at room temperature, and the flask was then immersed in an oil bath at 99.5° C. The reaction mixture was stirred under a nitrogen atmosphere. With the reaction solution temperature at 102.5° C., the AIBN solution was added dropwise to the flask over about 3 minutes. The reaction mixture was stirred under nitrogen for 24 hours at about 97°-105° C. Yield: 295.4 g of solution (99% recovery); 10.17 wt. % solids. The terpolymer III $M_w$ in solution via GPC was 18,650 g/mol, with a D of 2.6.

To precipitate the terpolymer from solution, a 4-liter beaker was charged with 2.0 liters of hexanes. About 199.9 g of the terpolymer III solution were added dropwise to the stirred hexanes over 0.5 hours. The mixture was then stirred at room temperature for 5 minutes. The solvent was removed from the terpolymer solids using vacuum filtration. The terpolymer solids were stirred with a fresh 200 ml of hexanes at room temperature for 5 minutes and the solvent again removed by vacuum filtration. Another 200 ml of hexanes were added with subsequent stirring being for minutes. The solvent rinse was removed by a vacuum filtration. The terpolymer was dried in a 40° C. vacuum oven, ground to a powder using a mortar and pestle, and then dried to constant weight in a 40° C. vacuum oven. Yield: 15.4 g (76% recovery). The terpolymer iii $M_w$ via GPC was 19,150 g/mol, with a D of 2)₃.

Example 8

Preparation of Bottom Anti-reflective Coating U sing Terpolymer III

In this procedure, a bottom anti-reflective coating was prepared using terpolymer III (AM) from Example 7, a PAG, and a quencher. A 250-ml amber Nalgene bottle was charged with 0.715 g of the crosslinker from Example 27, 2.421 g of terpolymer III, 157.060 g of PGME, and 39.54 g of PGMEA.

Next, about 1.256 g of a 1% quencher (1-Boc-4-hydroxypiperidine) in PGME solution were added, followed by 0.0427 g of TPS-Cl. The mixture was tumbled overnight at room temperature and was then filtered through a 0.1-μm endpoint filter.

The film and optical properties of the terpolymer III bottom anti-reflective coating were then determined as explained above in Example 2, and are provided in Table 2 of the Results below.

The contrast curve for the terpolymer III bottom anti-reflective coating was determined as previously described, and is shown in FIG. 2.

Next, 193-nm lithography was carried out as described above in Example 2. From the SEM photographs in FIG. 3, it can be seen that the 150-nm L/S (1:1) were present after 1.2- and 1.4-second exposures.

Example 9

Synthesis of Terpolymer IV and Precipitation Thereof

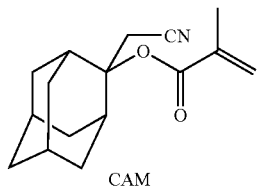 [SMILES: C=C(C)C(=O)OC1(CC#N)C2CC3CC(C2)CC1C3]

CAM

In this procedure, a terpolymer was synthesized using 12.9 mol % of CAM, methacrylic acid, and styrene. A 500-ml three-necked flask equipped with magnetic stirring bar and thermometer was charged with 8.59 g (33.1 mmol) of Adamantate® M-102 (CAM; Idemitsu Kosan Co., Ltd., Tokyo, Japan), 9.10 g (105.7 mmol) of methacrylic acid, 12.38 g (118.9 mmol) of styrene, and 202.70 g of PGME. The mixture was stirred for 2 minutes to produce a solution. A condenser with attached nitrogen outlet adapter and dropping funnel with attached nitrogen inlet adaptor were attached to the three-necked flask.

Next, a 60-ml Nalgene bottle was charged with 0.65 g (3.96 mmol) of AIBN and 54.91 g of PGME. The mixture was tumbled at room temperature for 0.5 hour, giving a solution. The solution was added to the dropping funnel. About 12.19 g of PGME was used to rinse the Nalgene bottle, and the PGME rinse was added to the dropping funnel. The reaction system was flushed with nitrogen for 15 minutes, and the flask was then immersed in an oil bath at 103.5° C. The reaction mixture was stirred under a nitrogen atmosphere. With the reaction solution temperature at 101.5° C., the AIBN solution was added drop-wise to the flask over about 3 minutes. The reaction solution was stirred under nitrogen for 24 hours at 97°-106° C. Yield: 295.9 g of solution (98.5% recovery); 10.19 wt. % polymer solids. The terpolymer IV $M_w$ in solution via GPC was 14,850 g/mol, with a D of 2.6.

To precipitate the terpolymer from solution, a 4-liter beaker equipped with overhead stirrer was charged with 2 liters of hexanes. A dropping funnel was charged with 200.0 g of the terpolymer IV solution. The terpolymer solution was added dropwise to the stirred hexanes over 17 minutes. The mixture was then stirred at room temperature for an additional 7 minutes, followed by removal of the solvent via vacuum filtration. The process was repeated by adding 200 ml of fresh hexanes to the flask, followed by stirring for 7.5 minutes, and solvent removal via vacuum filtration. For the final rinse, 200 ml of hexanes were added to the terpolymer solids, and the mixture was stirred for 8 minutes, followed by solvent removal by vacuum filtration. The terpolymer was dried in a 40° C. vacuum oven, ground to a powder using a mortar and pestle, and then dried to constant weight at 40° C. under vacuum. Yield: 14.0 g (69% recovery). The terpolymer IV $M_w$ via GPC was 14,950 g/mol, with a D of 2.2.

Example 10

Preparation of a Bottom Anti-Reflective Coating Using Terpolymer IV

In this procedure, a bottom anti-reflective coating as prepared using terpolymer (CAM from Example 9 above, a PAG, and a quencher. A 125-ml amber Nalgene bottle was charged with 0.3585 g of the crosslinker from Example 27, 0.6335 g of 1.001% quencher (1-Boc-4-hydroxypiperidine) in PGME, 1.213 g of terpolymer IV, 78.0985 g of PGME, and 9.687 g of PGMEA. The mixture was tumbled at room temperature for 33 minutes, followed by the addition of 20.9 mg of TPS-Cl. The mixture was tumbled at room temperature for approximately 72 hours, and then filtered through a 0.1-μm endpoint filter.

The film and optical properties of the resulting bottom anti-reflective coating were then determined as explained above in Example 2, and are provided in Table 2 of the Results below.

Figure 6:
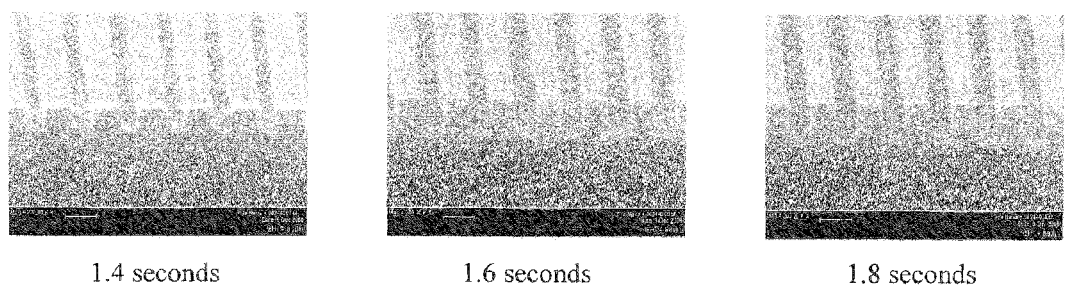
FIG. 6 depicts photographs of SEM cross-sections from 193-nm lithography carried out using the bottom anti-reflective coating prepared in Example 10 at various exposure times.

Next, 193-nm lithography was carried out as described above in Example 2 using resist ARX3001JN at 195-nm thickness. The SEM photos are shown in FIG. 6.

Example 11

Terpolymer V Synthesis and Precipitation Thereof

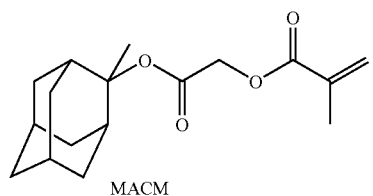 [SMILES: C=C(C)C(=O)OCC(=O)OC1(C)C2CC3CC(C2)CC1C3]

MACM

In this procedure, a terpolymer was synthesized using 12.9 mol % MACM, methacrylic acid, and styrene. A 500-ml three-necked flask equipped with thermometer and magnetic stirring bar was charged with 9.09 g (105.6 mmol) of methacrylic acid, 9.70 g (33.2 mmol) of Adamantate® M-103 (MACM: Idermitsu Kosan Co., Ltd., Tokyo, Japan). 12.365 g (118.7 mmol) of styrene, and 209.93 g of PGME. The mixture was stirred at room temperature for 3 minutes. A dropping funnel with nitrogen inlet adapter and condenser with nitrogen outlet adaptor were attached to the flask.

Next, a 125-ml Nalgene bottle was charged with (0.650 g (3.96 mmol) of AIBN and 69.65 g of PGME. The mixture was tumbled for 0.65 hours to produce a solution, and then charged to the dropping funnel. The reaction system was purged with nitrogen for 0.4 hours at approximately room temperature, and the flask was then immersed in an oil bath at 99.5° C. The reaction mixture was stirred under nitrogen. With the stirred solution temperature at 102° C. and nitrogen flowing, the AIBN solution was gradually added to the reaction solution over 2.75 minutes. The reaction solution was then stirred at about 95° C.-106° C. for 24 hours under nitrogen. Yield: 308.5 g of solution (99% recovery); 10.18 wt. % polymer solids. The terpolymer V $M_w$ in solution via GPC was 17,900 g/mol, with a D of 2.6.

To precipitate the terpolymer from solution, a dropping funnel was charged with 92.0 g of the terpolymer V solution, and a 1-liter beaker equipped with overhead stirrer was charged with 875 ml of hexanes. The terpolymer solution was added dropwise to the stirred hexanes over 8.5 minutes. The mixture was then stirred for an additional 0.2 hours, followed by solvent removal by vacuum filtration. The terpolymer was rinsed by adding about 85 ml of hexanes to the beaker, and stirring at room temperature for 5 minutes. The solvent was removed by vacuum filtration. The process was repeated using 87 ml of fresh hexanes and stirring at room temperature for 0.12 hour. The solvent was removed by vacuum filtration. The terpolymer was dried in a 40° C. vacuum oven, ground to a powder using a mortar and pestle, and dried to constant weight in a 40° C. vacuum oven. Yield: 7.28 g (78% recovery). The terpolymer V $M_w$ via GPC was 17,900 g/mol, with a D of 2.2.

Example 12

Preparation of a Bottom Anti-Reflective Coating Using Terpolymer V

In this procedure, a bottom anti-reflective coating was prepared using terpolymer V (MACM) from Example 11, a PAG, and a quencher. A 250-ml amber Nalgene bottle was charged with 0.535 g of the crosslinker from Example 27, 1.812 g of terpolymer V, 117.131 g of PGME, and 29.517 g of PGMEA. The mixture was tumbled at room temperature for 2.1 hours, followed by the addition of 0.943 g of 1.001 wt. % quencher (1-Boc-4-hydroxypiperidine) in PGME. The mixture was tumbled at room temperature for 0.5 hours, followed by the addition of 32.0 mg of TPS-Cl. The product was tumbled for about 72 hours at room temperature and filtered through a 0.1-μm endpoint filter.

The film and optical properties of the resulting bottom anti-reflective coating were then determined as explained above in Example 2, and are provided in Table 2 of the Results below.

Example 13

Synthesis of Terpolymer VI and Precipitation Thereof

In this procedure, a traditional acid-labile terpolymer was synthesized for comparison using 12.9 mol % t-butyl methacrylate, methacrylic acid, and styrene. A three-necked flask equipped with magnetic stirring bar, thermometer, addition funnel with nitrogen inlet, and condenser with nitrogen outlet was charged with 25.98 g (301.8 mmol) of methacrylic acid, 13.5 g (94.9 mmol) of t-butyl methacrylate, 35.37 g (339.6 mmol) of styrene, and 505.11 g of PGME.

In a separate container, a mixture of about 1.864 g (11.35 mmol) of AIBN in 168.3 g of PGME was prepared at room temperature to form a solution. The AIBN solution was added to the dropping funnel. The reaction system was purged with nitrogen for 15 minutes at ambient conditions, and the flask was then immersed in an oil bath at ~103° C., with stirring under nitrogen. When the reaction solution temperature reached 100° C., the AIBN solution was added from the dropping funnel at a fast drip. The stirred mixture was maintained at about 100° C. for 24 hours under nitrogen. The terpolymer VI $M_w$ in solution via GPC was 17,900 g/mol, with a D of 2.5.

To precipitate the terpolymer from solution, a portion (~300 ml) of the terpolymer VI solution was added to a 4-liter flask equipped with a stir bar and containing about 1,200 ml of hexanes. The terpolymer gummed in the bottom of the flask, so the hexanes were poured off, and the terpolymer was collected in another flask. The precipitation was repeated using the remaining polymerization solution. After precipitating the remaining terpolymer from solution, the material was rinsed twice with hexanes. The terpolymer was allowed to dry for 1 hour at room temperature in a 1-liter beaker and was then placed in a 50° C. vacuum oven and dried. The terpolymer VI $M_w$ via GPC was 19,600 g/mol, with a D of 2.1.

Example 14

Preparation of Bottom Anti-Reflective Coating Using Terpolymer VI

In this procedure, a bottom anti-reflective coating was prepared using terpolymer VI from Example 13, a PAG, and quencher. A container was charged with 1.216 g of terpolymer VI, 0.3588 g of the crosslinker from Example 27, 78.720 g of PGME, 19.680 g of PGMEA, 0.0063 g of quencher (1-Boc-4-hydroxypiperidine), and 0.0213 g of TPS-Cl. The mixture was stirred at room temperature to produce a solution, which was then filtered through a 0.1-μm endpoint filter.

The film and optical properties of the resulting bottom anti-reflective coating were then determined as explained above in Example 2, and are provided in Table 2 of the Results below.

The contrast curve for the terpolymer III bottom anti-reflective coating was determined as previously described, and is shown in FIG. 2.

Next, 193-nm lithography was carried out as described above in Example 2, with the results shown in FIG. 3.

Example 15

Terpolymer VII Synthesis and Precipitation Thereof

In this procedure, a terpolymer was synthesized using 21.9 mol % of EM, methacrylic acid, and styrene. A 500-ml three-necked flask equipped with magnetic stir bar and thermometer was charged with 17.72 g (71.3 mmol) of Adamantate® EM, 15.84 g (152.1 mmol) of styrene, 8.80 g (102.2 mmol) of methacrylic acid, and 267.66 g of PGME. A condenser with nitrogen outlet adaptor and dropping funnel with nitrogen inlet adaptor were attached to the flask.

Next, a 125-ml Nalgene bottle was charged with 0.837 g (5.10 mmol) of AIBN and 89.196 g of PGME. The materials were mixed at room temperature until dissolved and then added to a dropping funnel. The reaction flask was immersed in an oil bath at 105° C. When the reaction solution temperature reached about 100° C., the AIBN solution was added at a fast drip. The reaction mixture was kept at temperature for 24 hours and then allowed to cool. The terpolymer VII $M_w$ in solution via GPC was 13,300 g/mol, with a D of 2.3.

A portion (~380 g) of the terpolymer VII solution was precipitated in 1,900 ml of hexanes. The terpolymer was rinsed three times with ~50 ml aliquots of hexanes and then dried in a 40° C. vacuum oven. Yield: 16.65 g (~44% recovery). The terpolymer VII $M_w$ via GPC was 15,700 g/mol, with a D of 1.7.

Example 16

Preparation of a Bottom Anti-Reflective Coating Using Terpolymer VII

In this procedure, a bottom anti-reflective coating was prepared using terpolymer VII (21.9 mol % EM) from Example 15, a PAG, and quencher. A container was charged with 1.2129 g of terpolymer VII, 0.360 g of the crosslinker from Example 27, 78.08 g of PGME, 19.67 g of PGMEA, 0.639 g of 1% quencher (1-Boc-4-hydroxypiperidine) in PGME, and 0.0220 g of TPS-Cl. The mixture was stirred at room temperature to produce a solution, and then filtered through a 0.1-μm endpoint filter.

The film and optical properties for the terpolymer VII bottom anti-reflective coating were then determined as described above in Example 2. The results are shown in Table 2.

The contrast curve for the terpolymer VII bottom anti-reflective coating was also determined as described above in Example 2, and is shown in FIG. 2.

Example 17

Preparation of a PAG-Less Bottom Anti-Reflective Coating Using Terpolymer VII

In this procedure, a bottom anti-reflective coating was prepared using terpolymer VII from Example 15, without a PAG or quencher. A 125-ml amber Nalgene bottle was charged with 1.2133 g of terpolymer VII, 0.183 g of the crosslinker from Example 27, 68.679 g of PGME, and 17.169 g of PGMEA. The mixture was tumbled at room temperature for 4.1 hours and then filtered through a 0.1-μm endpoint filter.

Figure 7:
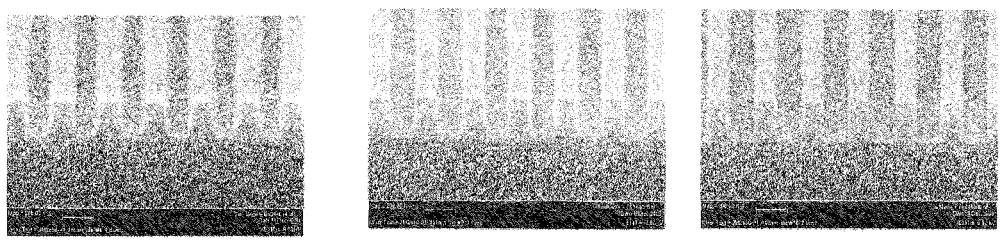
FIG. 7 shows photographs of SEM cross-sections from 193-nm lithography carried out using the bottom anti-reflective coating prepared in Example 17 at various exposure times.

The resulting bottom anti-reflective coating was spin applied to silicon wafers at 1500 rpm for 30 or 60 seconds and baked at 160° C. for 60 seconds, resulting in a film thickness of 53.3 nm. The 193-nm lithography for this bottom anti-reflective coating, using resist ARX3001JN and a PAB/PEB at 110° C. for 60 seconds is shown in FIG. 7.

Examples 1-17

Results

In Examples 1-12 and 15-17, the traditional acid-labile monomer, such as a t-butyl ester (see Examples 13 and 14), which is a high activation energy group, was replaced with an adamantyl methacrylate monomer, which requires a lower activation energy. Given that the acid-labile monomer is only a small percentage of the overall polymer, this minor modification produced dramatic and unexpected changes in: 1) the derived bottom anti-reflective coatings' contrast curves and dose-to-clear ($E_o$); and 2) the bottom anti-reflective coatings' performance in 193-nm lithography.

TABLE 1

Description of Terpolymers.

| Identity of Terpolymer | Acid-labile Monomer | Molar Percentage of Acid-labile Monomer (as charged) | Molar Percentage of AIBN (as charged) | Percent Recovery of Charged Polymerization Solution | Percent Yield from Hexanes Precipitation | Terpolymer Molecular Weight ($M_w$/D) |
|---|---|---|---|---|---|---|
| I | IPM | 12.9 | 1.6 | 99 | 62 | 15,150/2.8 (soln) 16,050/2.1 (ppt) |
| II | EM | 12.9 | 1.5 | 99 | 69 | 15,250/2.5 (soln) 16,850/2.1 (ppt) |
| III | AM | 12.9 | 1.6 | 99 | 75 | 18,650/2.6 (soln) 19,150/2.3 (ppt) |
| IV | CAM | 12.8 | 1.5 | 98 | 69 | 14,850/2.6 (soln) 14,950/2.2 (ppt) |
| V | MACM | 12.9 | 1.5 | 99 | 78 | 17,900/2.6 (soln) 17,900/2.2 (ppt) |
| VI | alkyl ester | 12.9 | 1.5 | — | ~68 | 17,900/2.5 (soln) 19,600/2.1 (ppt) |
| VII | EM | 21.9 | 1.5 | — | ~44 | 13,300/2.3 (soln) 15,700/1.7 (ppt) |

TABLE 2

Bottom Anti-reflective Coating Film and Optical Properties.

| Bottom anti-reflective coating | Terpolymer | Film Thickness, nm | EL Stripping | Development, Unexposed Areas (Dark Loss) | 193-nm n/k |
|---|---|---|---|---|---|
| Example 2 | I | 53.0 | +0.5% | +0.0% | 1.69/0.54 |
| Example 3 | I | 54.0 | +0.47% | +0.21% | 1.69/0.54 |
| Example 5 | II | 53.9 | +1.3% | +0.2% | 1.70/0.54 |
| Example 6 | II | 47.8 | +0.96% | +0.58% | 1.68/0.54 |
| Example 8 | III | 52.8 | +0.4% | +0.0% | 1.68/0.51 |
| Example 10 | IV | 54.4 | +0.4% | +0.3% | 1.67/0.51 |
| Example 12 | V | 52.6 | +0.8% | +1.8% | 1.72/0.48 |
| Example 14 | VI | 56.4 | +0.9% | −0.8% | 1.68/0.56 |
| Example 16 | VII | 53.5 | +0.4% | −1.5% | 1.69/0.49 |

Example 18

Preparation of a PAG-Less Bottom Anti-Reflective Coating Using Terpolymer I and a Polymeric Amine Additive In this procedure, a PAG-less bottom anti-reflective coating was prepared using terpolymer I (IPM) from Example I above, along with a polymeric amine additive (quencher). A 250-ml amber Nalgene bottle was charged with 0.536 g of the crosslinker from Example 27, 0.52 mg of a 1:1 mol copolymer of 4-vinyl pyridine and t-Boc-oxystyrene (synthesized in-house), 116.710 g of PGME, 29.186 g of PGMEA, and 1.817 g of terpolymer 1. The mixture was tumbled at room temperature for 17 hours resulting in a solution, and then twice filtered through a 0.1 μm end-point filter.

The resulting bottom anti-reflective coating was spin applied to a silicon wafer at 1,500 rpm for 60 seconds, and then baked at 160° C. for 60 seconds. The optical and film properties of the resulting bottom anti-reflective coating are provided in Table 3 below, along with the properties of a PAG-less terpolymer I bottom anti-reflective coating that was prepared according to the procedures in Example 3 above (no amine additive).

For 193-nm lithography, the anti-reflective coating was spin applied onto a silicon wafer at 1,500 rpm for 30 seconds, followed by baking at 160° C. for 60 seconds. The resulting film had a thickness of about 52 nm. A photoresist (ARX3001JN at 190 nm) was applied, followed by a PAB at 110° C. for 60 seconds. An ASML 1100-ArF scanner was used for the exposures, followed by a PEB at 106° C. for 60 seconds. The exposure conditions are shown below.

| Illumination mode - | annular |
|---|---|
| NA - | 0.75 |
| Sigma - | 0.85/0.57 |
| Target CD - | 130-nm L/260-nm P (bright field) |
| Development - | OPD262[A] for 45 seconds |

[A]TMAH, ARCH Semiconductor Chemicals

Figure 8A:
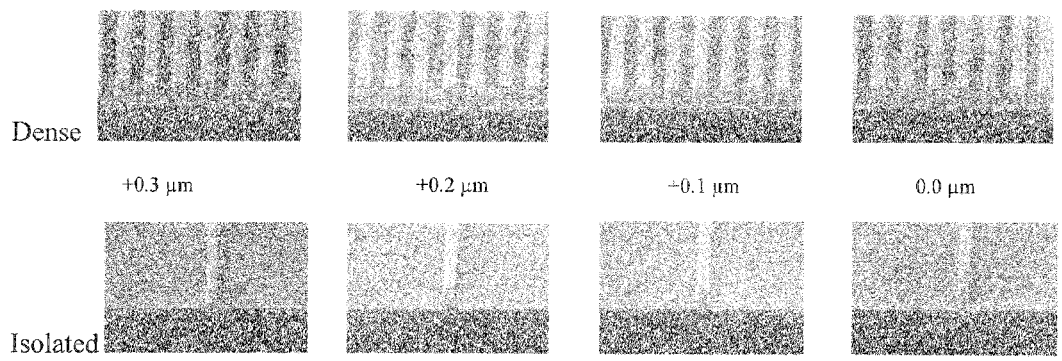
FIG. 8(a) depicts photographs of SUM cross-sections of dense and isolated lines from 193-nm lithography carried out using the bottom anti-reflective coating prepared in Example 18 at various exposure times.
Figure 8B:
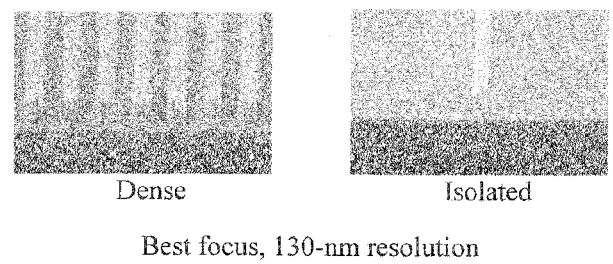
FIG. 8(b) depicts an enlarged view of the best SEM cross-sections of the dense and isolated lines from FIG. 8(a)

As shown in FIGS. 8(*a*) and 8(*b*), the 130-nm dense (1:1) and isolated lines showed little undercutting. Depth-of-focus (DOF) for both dense and isolated lines at an exposure dose of 27 mJ/cm$^2$ was about 0.3 μm. The spaces were clean, excluding some resist microbridging observed in the dense pattern. This bottom anti-reflective coating shows potential for even smaller CDs.

Example 19

Synthesis of Adamantyl Polymer Including NAMA

In this procedure, a new polymer solution was prepared by incorporating a fourth monomer 2-naphthoic acid-3-methacrylate (NAMA) into the terpolymer I binder at 14 wt. % of the monomer mixture. A 500-ml three-necked flask equipped with magnetic stirring bar and thermometer was charged with 9.09 g (105.6 mmol) of methacrylic acid, 10.56 g (101.4 mmol) of styrene, 8.72 g (33.2 mmol) of Adamantate® M-105 (IPM; Idemitsu Kosan Co., Ltd., Tokyo, Japan), 4.56 g (17.8 mmol) of NAMA, and 221.55 g of PGME. A condenser with nitrogen outlet adaptor and dropping funnel with nitrogen inlet adaptor were attached to the flask. The mixture was stirred at room temperature for about 4.5 minutes resulting in a dust-like suspension/solution.

A solution of 0.680 g (4.14 mmol) of AIBN in 73.60 g of PGME was then prepared and charged to the dropping funnel. The reaction mixture was purged with nitrogen at room temperature for about 15 minutes, and the flask was then immersed in an oil bath at 106° C. When the stirred reaction solution reached 104° C., the AIBN solution was added dropwise over 2 minutes. The reaction mixture was stirred at about 196-104° C., ours, and then allowed to cool. Yield: 321.1 g of solution (98% recovery); 10.19 wt % polymer solids. The $M_w$ for the NAMA-adamantyl polymer in solution via GPC was 13,200 g/mol, with a D of 2.34.

To precipitate the polymer from solution, a 4-liter beaker equipped with an overhead stirrer and stirring rod was charged with 1 liter of hexanes. A dropping funnel was charged with 100.5 g of the polymer solution, and then added dropwise to the stirred hexanes over 9 minutes, followed by stirring at room temperature for an additional 10 minutes. The solvent was removed by vacuum filtration. The beaker with the polymer was placed in a 50° C. vacuum oven for 0.5 hours, followed by drying at room temperature for 3 days. The beaker was then placed back in the 50° C. vacuum oven for 21.5 hours. The polymer was then ground to a powder with a mortar and pestle, followed by drying to a constant weight in a 50° C. vacuum oven. Yield: 6.36 g (62% recovery). The $M_w$ of the precipitated polymer via GPC was 13,450 g/mol, with a D of 2.16.

Example 20

Preparation of Bottom Anti-Reflective Coating from NAMA-Adamantyl Polymer

In this procedure, a bottom anti-reflective coating was prepared using the NAMA-containing adamantyl polymer prepared in Example 20 above. A 250-ml amber Nalgene bottle was charged with 0.542 g of the crosslinker from Example 27, 1.826 g of the NAMA polymer, 118.011 g of PGME, and 29.169 g of PGMEA. The mixture was tumbled at room temperature overnight and then twice filtered through a 0.1-µm end-point filter.

The resulting bottom anti-reflective coating was spin applied to a silicon wafer at 1,500 rpm for 30 seconds, and then baked at 160° C. for 60 seconds. The film and optical properties of the resulting NAMA-containing adamantyl bottom anti-reflective coating are provided in Table 3 below, along with the properties of a PAG-less terpolymer I bottom anti-reflective coating prepared according to the procedures in Example 3 above.

Next, 193-nm lithography was carried out using an ASML 1100-ArF scanner. The anti-reflective coating was spin applied onto a silicon wafer at 1,500 rpm for 30 seconds, followed by baking at 160° C. for 60 seconds. The resulting film had a thickness of about 49 nm. A photoresist (ARX3001JN at 190 nm) was applied, with a PAB and PEB both at 110° C. for 60 seconds. It was found that a PEB at 106° C. for 60 seconds produced dirtier spaces for both dense L/S and isolated lines. The exposure conditions are shown below.

| | |
|---|---|
| Illumination mode - | annular |
| NA - | 0.75 |
| Sigma - | 0.85/0.567 |
| Target CD - | 130-nm L/260-nm P (bright field) |
| Development - | OPD262 for 45 seconds |

Figure 9A:
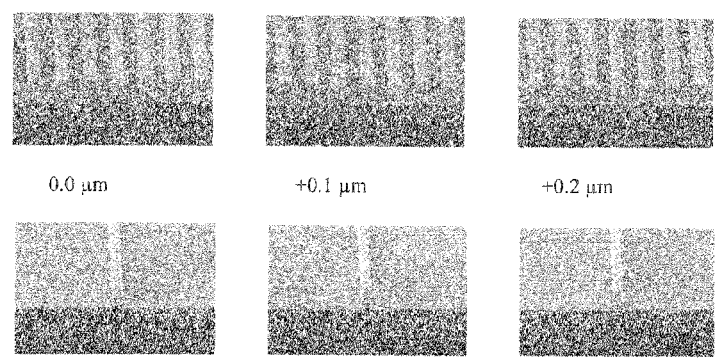
FIG. 9(a) shows photographs of SEM cross-sections of dense and isolated lines from 193-nm lithography carried out using the bottom anti-reflective coating prepared in Example 20 at various exposure times.
Figure 9B:
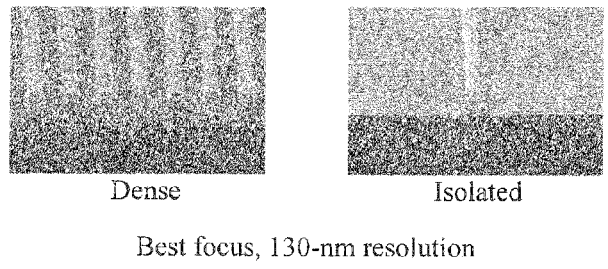
FIG. 9(b) depicts an enlarged view of the best SEM cross-sections of the dense and isolated lines from FIG. 9(a)

As seen in the SEM cross-section photographs in FIGS. 9(a) and 9(b), nice 130-nm LS (1:1 and isolated lines) were obtained with about 0.2 µm DOF for both dense and isolated lines at an exposure dose of 25 mJ/cm².

Film and Optical Results Examples 18-20

The film thicknesses shown are only from the wafers used for the EL stripping. For dark loss evaluation, the coatings were subjected to a PEB at 110° C. for 60 seconds before solvent puddling.

TABLE 3

Bottom Anti-reflective Coating Film and Optical Properties.

| Bottom anti-reflective coating | Polymer binder | Film Thickness | EL stripping, % | Dark Loss, % | 193-nm n/k |
|---|---|---|---|---|---|
| Example 3 | terpolymer I | 52 nm | +0.8 | +0.6 | 1.66/0.54 |
| Example 18 | terpolymer I | 52.5 nm | +0.8 | +0.6 | 1.65/0.54 |
| Example 20 | terpolymer I + NAMA | 49 nm | −0.4 | +0.8 | 1.67/0.50 |

Example 21

Lithography Comparison with a PAG-less Terpolymer I Anti-reflective Coating and Additional 93-nm Photoresists In this procedure, selected lithography was carried out using two commercially-available photoresists and a PAG-less bottom anti-reflective coating prepared according to the procedure in Example 3 above (IMP terpolymer 1). For each test, the bottom anti-reflective coating was spin applied onto a silicon wafer at 1,500 rpm for 30 seconds, followed by baking at 160° C. for 60 seconds. The film had a thickness of 55 nm. A commercially-available photoresist (TArF-Pi6-001 from TOK; or SAIL-X-181 from Shin-Etsu) was then applied to the film. The conditions and exposure parameters for each photoresist are provided below.

| | TArF-Pi6-001 | SAIL-X-181 |
|---|---|---|
| PAB | 110° C. for 60 seconds | 105° C. for 60 seconds |
| Resist thickness | 130 nm | 155 nm |
| Illumination mode | conventional | dipole35Y |
| NA | 0.75 | 0.75 |
| Sigma | 0.89 | 0.89:0.65 |
| Target CD | 130-nm L/260-nm P (bright field) | 80-nm L/160-nm P (bright field) |
| PEB | 114° C. for 60 seconds | 110° C. for 60 seconds |
| Development | OPD262 45 seconds | OPD262 45 seconds |

Figure 10:
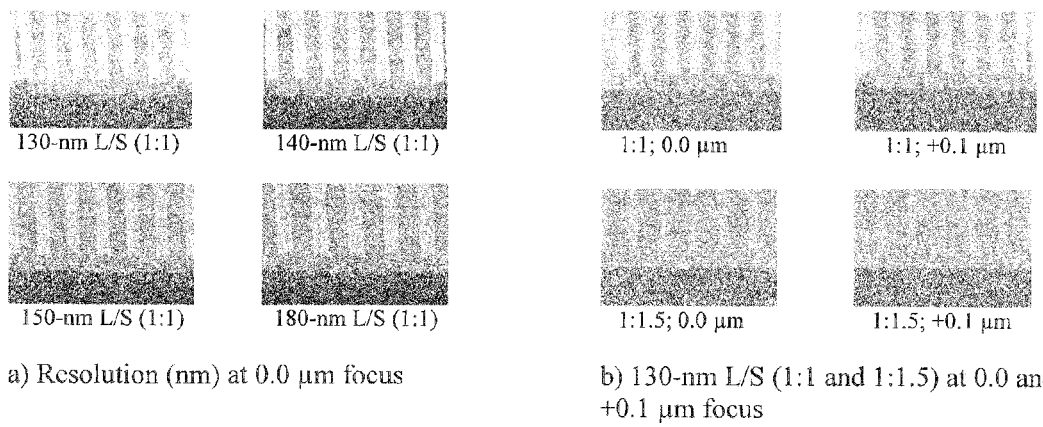
FIG. 10 shows photographs of SEM cross-sections from 193-nm lithography carried out using the bottom anti-reflective coating prepared in Example 21 and two different commercially-available photoresists: a) TarF-Pi6-001 (from TOK); and b) SAIL-X-181 (from Shin-Etsu)

An ASML 1100-ArF scanner was used for the exposures. The SEM cross-sections are shown in FIG. 10. For resist TArF-Pi6-001 (a), selected through-resolution lithography results are shown at 0.0 µm focus. For resist SAIL-X-181 (b), the resolution was 130 nm at 1:1 and 1:1.5 L/S at 0.0 and +0.1 µm focus. This resist displays less photoacid diffusion/activity.

Overall, this example demonstrates that the inventive PAG-less terpoylmer I bottom anti-reflective coating exhibits surprising compatibility with a variety of resists.

Example 22

Sublimation of a PAG-less Terpolymer I Anti-reflective Coating

Figure 11:
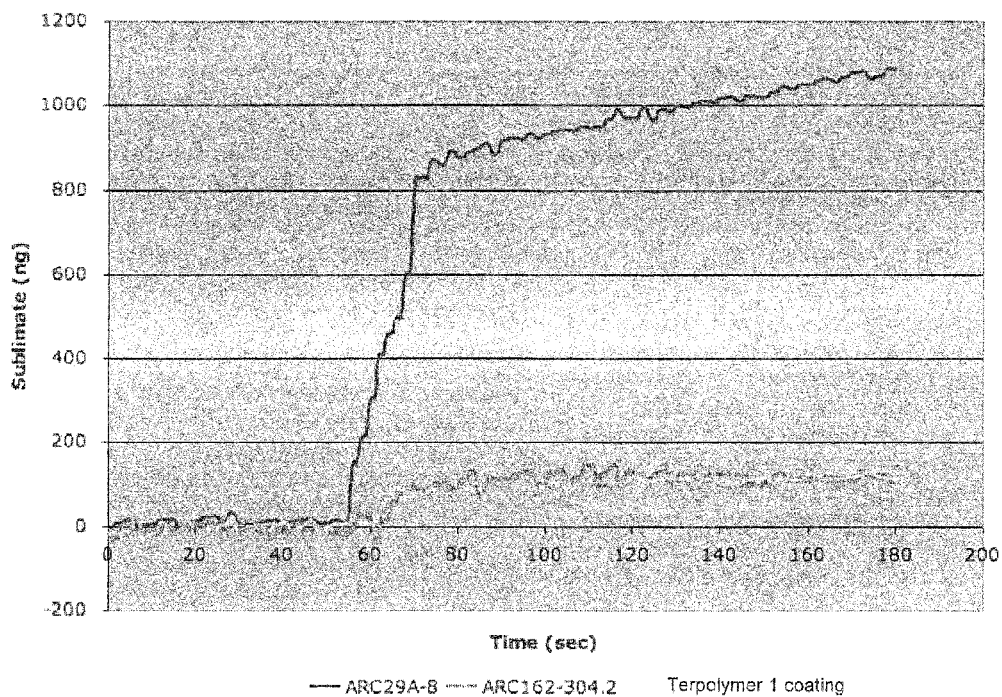
FIG. 11 is a graph comparing the sublimate over time of a bottom anti-reflective coating prepared in Example 22 with two commercially-available 193-nm dry bottom anti-reflective coatings.
Figure 12:
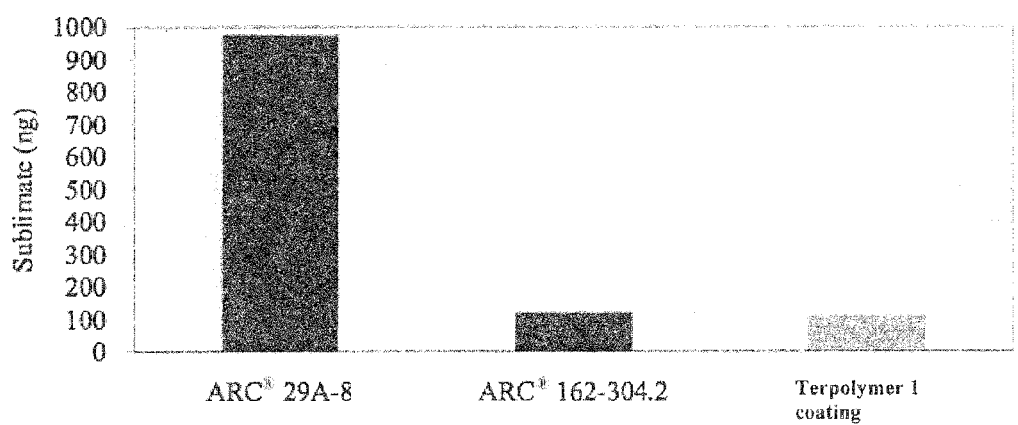
FIG. 12 is a bar graph of the total sublimate collected in Example 22 for each anti-reflective coating.

In this procedure, the sublimation of a PAG-less anti-reflective coating prepared according to the procedures of Example 3 during the bake step was compared to the sublimate from two commercially-available 193-nm dry bottom anti-reflective coatings. A quartz crystal microbalance (QCM) was mounted above a nozzle attached to a glass bell jar. Vacuum was applied to allow the sublimate to travel up to the crystal then collection, where the condensing sublimate is registered based upon the changes in crystal frequency. Solvent that does not condense is not measured. An electrode connected to the crystal then transfers the data to a computer, which graphs the change in frequency in real time. This is calculated into nanogram of sublimate versus heating time in seconds. The standard 193-nm dry-developed bottom anti-reflective coating controls were ARC 29A-8 and ARC® 162-304-2 (both from Brewer Science Inc, Rolla, Mo.). The bake parameters were 160° C. for 120 seconds for the PAG-less terpolymer I bottom anti-reflective coating (thickness of 49.5 nm), and 205° C. for 120 seconds for the dry bottom anti-reflective coatings (thicknesses of 75.3 nm and 39.1 nm, respectively). The hot plate was held at the designated temperature for approximately one minute prior to placing the just-coated wafer under the glass bell jar for sublimation collection. The results and comparison are shown in FIGS. 11-12. The PAG-less terpolymer I bottom anti-reflective coating had much lower sublimation than dry bottom anti-reflective coating ARC® 29A-8, and about the same level of sublimation as dry bottom anti-reflective coating ARC® 162-304-2.

Example 23

Comparison of Post-Development Residue on Silicon Wafer

In this procedure, the amount of post-development residue on a silicon substrate of a PAG-less terpolymer I bottom anti-reflective coating prepared according to Example 3 was compared with residue from a commercially-available wet developable anti-reflective coating. Coated wafers were prepared using a photoresist (ARX3001JN) with both the PAG-less terpolymer I bottom anti-reflective coating, and ARCR DS-A520 (from Brewer Science Inc.) and processed using an ACT8 Tel track and an ASML PAS5500™/1100 scanner for the exposures. The film thicknesses were identical (55 nm) for both anti-reflective coatings. The PEB for the PAG-less bottom anti-reflective coating was 106° C. for 60 seconds, while a PEB of 110° C. for 60 seconds was used for ARC® DS-A520. The photoresist film thickness ranged between 190 nm to 200 nm, with a PAB of 110° C. for 60 seconds. A meandering dose matrix was created using open frame exposure, with conventional illumination. After development with OPD262 for 45 seconds, a Woollam M2000 ellipsometer was used to measure the remaining organic residue.

Figure 13:
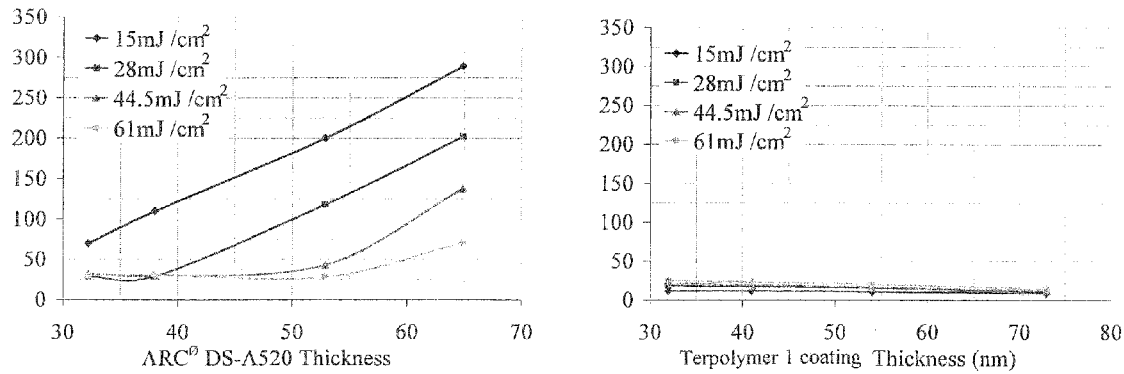
FIG. 13 shows two graphs comparing the post-development residue on a silicon wafer of an inventive bottom anti-anti-reflective coating from Example 23 with the residue of a commercially-available wet-developable anti-reflective coating at different exposure doses.

The results are shown in FIG. 13, and demonstrate that the post-development residue for the PAG-less bottom anti-reflective coating on a silicon substrate is much less dependent on initial film thickness than the earlier generation ARC DS-A520. A slight trend can be seen showing a decrease in residue with an increase in film thickness for the PAG-less terpolymer I anti-reflective coating. A similar trend was observed from through-exposure dose measurements. Over substrate topography, thickness variations result, indicating that residue issues should be less for the inventive PAG-less bottom anti-reflective coating than for the traditional wet-developable coatings. Changes in radiation energy in the range of 15 mJ/cm$^2$ to 61 mJ/cm$^2$ led to differences in post-development residue with ARC t DS-A520. However, using resist ARX300JN and the PAG-less bottom anti-reflective coating, there was minimal change in post-development residue across 15 mJ/cm$^2$ to 61 mJ/cm$^2$ exposure doses.

Example 24

Comparing Post-Development Residues on a Silicon Nitride Substrate

Figure 14:
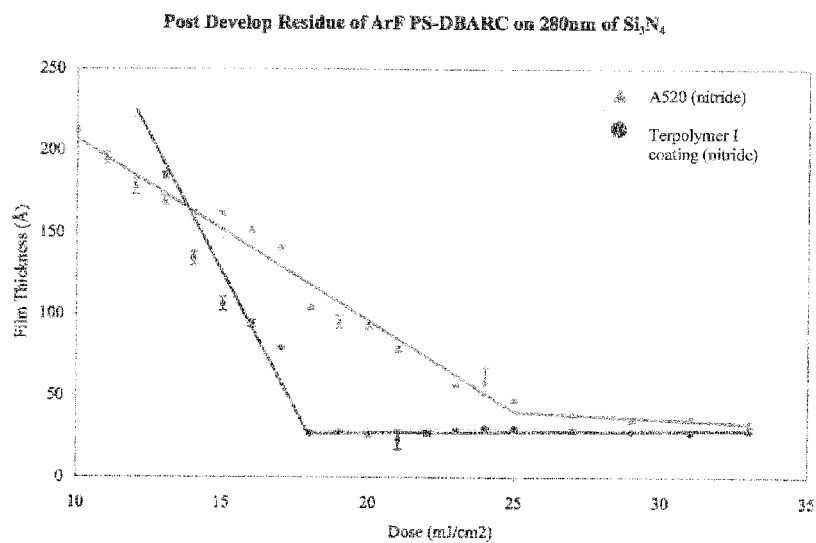
FIG. 14 is a graph comparing the post-development residue on a silicon nitride of an inventive bottom anti-anti-reflective coating from Example 24 with the residue of a commercially-available wet-developable anti-reflective coating.

In this procedure, the amounts of residue on silicon nitride-deposited substrates were compared using two wet developable anti-reflective coatings. A PAG-less terpolymer I bottom anti-reflective coating prepared according to Example 3, and ARC® DS-A520 (from Brewer Science Inc.) were spin-applied to identical silicon nitride substrates and then baked at 160° C. for 60 seconds giving a film thickness of 55 nm for each composition. Both coated wafers were then spin-coated with a photoresist (ARX3001JN), resulting in a 190 nm resist film after a PAB at 110° C. for 60 seconds. Open frame ArF radiation was carried out with a Nikon NSR-S307E tool, followed by a PEB of 106° C. for 60 seconds for the inventive PAG-less bottom anti-reflective coating, and a PEB of 114° C. for 60 seconds ARC® DS-A520. The exposed stacks were then developed with NMD-3 2.38% (TMAH; Ohka America, Inc., Milpitas, Calif.) for 60 seconds. The residue data for both bottom anti-reflective coatings are plotted in FIG. 14 as residue thickness versus exposure dose. The nitride thickness was measured at or near each data point measurement. The residue from the PAG-less terpolymer bottom anti-reflective coating sharply decreased through dose until an asymptote was reached near 18 ml/cm$^2$, and then the amount of residue remained stable through dose. Thus, for ArF exposure doses of 14 to 25 mJ/cm$^2$, the PAG-less terpolymer I bottom anti-reflective would be expected to produce less residue than the traditional wet-developable anti-reflective coating on silicon nitride substrates. The inventive PAG-less bottom anti-reflective coating was also observed to result in the least residue, particularly at dose-to-clear ($E_o$).

Example 25

Additional Lithography with a PAG-less Terpolymer I Bottom Anti-reflective Coating In this procedure, the resolution performance of a PAG-less adamantyl bottom anti-reflective coating prepared according to Example 3 using photoresist ARX3001JN (190-nm thickness) was studied. An ASML 1100-ArF scanner was used for the exposures, with a PAB of 110° C. for 60 seconds and various PEB temperatures (102° C., 106° C., 110° C., 114° C.) each for 60 seconds. The exposure conditions are shown below.

| | |
|---|---|
| Illumination mode - | conventional |
| NA - | 0.75 |
| Sigma - | 0.89 |
| Target CD - | 130-nm L/260-nm P (bright field) |
| Development - | OPD262 for 45 seconds |

Figure 15A:
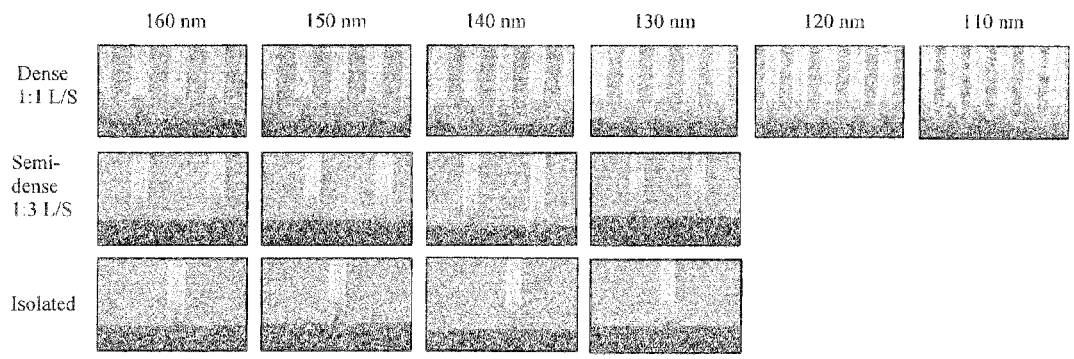
FIG. 15(a) shows photographs of SEM cross-sections of dense, semi-dense, and isolated lines from the 193-nm lithography in Example 25 for resolutions of 110 nm through 160 nm at a PEB of 106° C.

SEM photographs of cross-sections were prepared at an SEM-cross-section-identified best exposure dose of 25 mJ/cm$^2$ and at 0.0 µm focus. The photographs for resolutions of 110 nm through 160 nm at a PEB of 106° C. are shown in FIG. 15(a). Acceptable L/S (1:1, 1:3, and isolated lines) were achieved at 130-, 140-, 150-, and 60-nm resolutions. The dense (1:1) L/S were acceptable at 120-nm resolution, but the isolated lines were lost. Minimal residue was observed in the open areas.

Figure 15B:
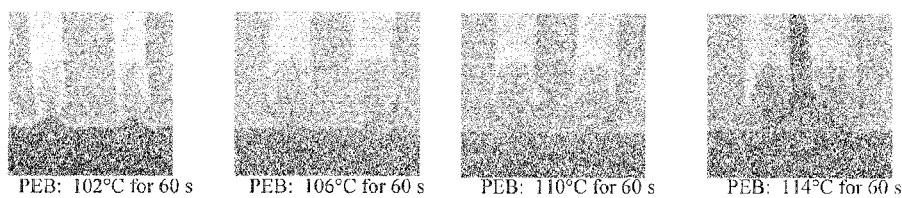
FIG. 15(b) shows photographs of SEM cross-sections from the 193-nm lithography carried out in Example 25 at different PEB temperatures.

At 130-nm resolution, the iso/dense bias by CD-SEM using a KLA 8100XP was about n, which is within 10% of target CD for 1:3 L/S and isolated lines, in all of the SEM photographs shown, the lines exhibited an undercut or pinch at their bases at resolutions of 120 nm through 160 nm. DOE for the 102° C. and 106° C. PEBs was 0.30 µm, while the 114° C. PEB gave a slightly higher DOF of 0.40 µm. As the undercut increased with an increase in PEB, the 114° C. PEB yielded a 0.10 µm DOF. FIG. 15(b) contains the lithographic results for the testing through-PEB These data demonstrate that as the PEB increases, the bottom anti-reflective coating undercuts more severely, indicating substantial acid diffusion into the unexposed areas. This anti-reflective coating and photoresist combination was considered to have about an 8° C. PEB window. This photoresist results in consistent acid diffusion into the bottom anti-reflective coating, as shown in the profiles in FIGS. 15(a)-(b).

Example 26

Additional Lithography with a PAG-Less Terpolymer I Bottom Anti-Reflective Coating In this procedure, the resolution performance of a PAG-less terpolymer I bottom anti-reflective coating prepared according to Example 3 using photoresist ARX3340J (JSR Micro) at a 230-nm thickness was studied. An ASML 1250-ArF scanner was used for the exposures, with a PAB of 110° C. for 60 seconds and various PEB temperatures (106° C., 110° C., 114° C., and 118° C.) each for 60 seconds. The exposure conditions are shown below.

| | |
|---|---|
| Illumination mode - | conventional |
| NA - | 0.85 |
| Sigma - | 0.5 |
| Target CD - | 150-nm S/375-nm P (dark field) |
| Development - | OPD262 for 45 seconds |

Figure 16:
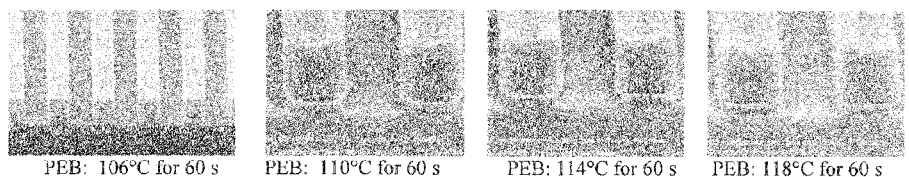
FIG. 16 shows photographs of SEM cross-sections from the 193-nm lithography carried out in Example 26 at different PEB temperatures using an inventive anti-reflective coating composition.

The resulting SEM photographs of the cross-sections are shown in FIG. 16. The DOF for these patterns was about 0.25 µm for all three of the lower PEB temperatures using exposure doses of 21, 20, and 20 mJ/cm$^2$ (respectively), but only about 0.10 µm for the highest PEB temperature at an exposure dose of 20 mJ/cm$^2$. These results represent an 8° C. PEB window. The tops of the resist lines tended to be indented, and some slight undercutting occurred at the base of the lines, However, the undercutting appeared to be much less than with photoresist ARX3001JN. Even as the PEB temperature increases, the undercut of the anti-reflective coating is more consistent when compared to behavior with photoresist ARX3001JN, as shown in FIG. 15(b). Overall, photoresist ARX3340J showed good compatibility with this bottom anti-reflective coating, contributing enough acid to de-crosslink and de-protect the film while maintaining limited undercut into the unexposed areas. So while the PEB window was similar to that for photoresist ARX3001JN, the bottom anti-reflective coating profile behavior was improved.

Example 27

Vinyl Ether Crosslinker Formulation

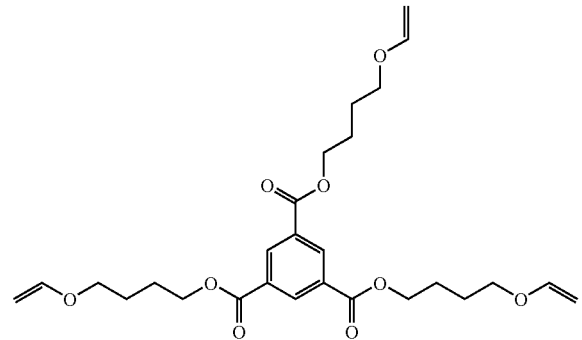 [SMILES: C=COCCCCOC(=O)c1cc(C(=O)OCCCCOC=C)cc(C(=O)OCCCCOC=C)c1]

In this procedure, the in-house vinyl ether crosslinker (tris [4-(vinyloxy)butyl]-benzentricarboxylate) used in Examples 2, 3, 5, 6, 8, 10, 12, 14, 16-18, and 20 was prepared by adding 25.15 g of tetramethylene glycol monovinyl ether (Aldrich, St Louis, Mo.), 22.91 g of triethylamine (Aldrich, St Louis, Mo.), and 250 ml tetrahydrofuran (THF Aldrich, St. Louis, Mo.) to a 500-ml, 2-neck flask. The flask was equipped with a stir bar, addition funnel, condenser, and nitrogen inlet and outlet. The flask was immersed in an ice water bath and the solution was stirred under a flow of nitrogen.

Next, 20.00 g of 1,3,5-benzenetricarbonyl trichloride (Aldrich, St. Louis, Mo.) were dissolved in 50 ml THF in a 250-ml Erlenmeyer flask. This solution was transferred to the addition funnel on the 500-ml 2-neck ask and added dropwise to the stirring tetramethylene glycol monovinyl ether/triethylamine/THF solution for about 15 minutes, until the addition was completed. A white precipitate formed on contact. The flask was then removed from the ice bath and the slurry was allowed to come to room temperature in the flask, which took approximately 16 hours. The slurry was then heated to reflux for 4 hours. The flask was removed from the heat and allowed to cool to room temperature. The slurry was then filtered using a suction filtration setup, and concentrated using a rotary evaporator to give a viscous yellow liquid.

This liquid was dissolved in 100 ml of diethylether (Aldrich, St. Louis, Mo.) and washed twice with 25-ml portions of aqueous, 12.5% TMAH (Aldrich, St. Louis, Mo.). The ether layer was extracted using a separatory funnel and then washed twice using 50-ml portions of deionized water. The ether layer was allowed to settle out and collected. The ether layer was dried by mixing with 5.0 g of activated basic alumina. The mixture was stirred for 1 hour and gravity filtered. The clear yellow liquid was concentrated in a rotavap to give a yellow viscous oil. Total yield was approximately 29.28 g (77% yield).

Example 28

Additional Vinyl Ether Crosslinker Formulation

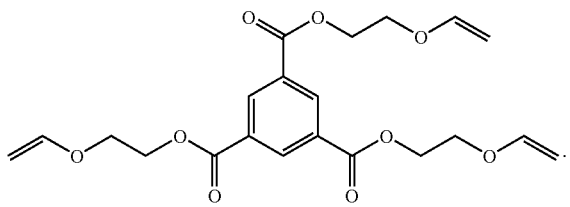 [SMILES: C=COCCOC(=O)c1cc(C(=O)OCCOC=C)cc(C(=O)OCCOC=C)c1]

In this Example, the preparation of another crosslinker is described. The crosslinker can be prepared by adding 24.70 g of 2-(vinyloxy)ethanol, 27.44 g of triethylamine, and 300 ml THF to a 500-ml, 2-neck flask. The solution can be immersed in an ice water bath and stirred under a flow of nitrogen.

Next, 24.01 g of 1,3,5-benzenetricarbonyl trichloride can be dissolved in 100 ml THF in a 250-ml Erlenmeyer flask. This solution will then be added dropwise to the 2-(vinyloxy) ethanol/triethylamine/THF solution until the addition is complete. The slurry can then be brought to room temperature and then heated to reflux for about 4 hours. The slurry can be cooled to room temperature and then filtered using a suction filtration setup. The solution will then be concentrated using a rotary evaporator to give a viscous yellow liquid.

Next, the liquid will be dissolved in 100 ml of ether and washed twice with 50-ml portions of aqueous TMAH. The ether layer can then be extracted and washed twice using 50-ml portions of deionized water. The ether layer will then be dried over anhydrous magnesium sulfate. Finally, the solvent can be removed under pressure.

We claim:

1. A method of forming a microelectronic structure, said method comprising:
   (a) providing a substrate having a surface;
   (b) forming an anti-reflective layer on said surface, said anti-reflective layer being formed from an anti-reflective composition comprising a polymer dissolved or dispersed in a solvent system, said polymer comprising recurring monomeric units having adamantyl groups, wherein said anti-reflective composition comprises less than about 0.005% by weight acid generator, based upon the total weight of the composition taken as 100% by weight; and
   (c) applying a photoresist to said anti-reflective layer to form an imaging layer.

2. The method of claim 1, wherein said adamantyl groups are acid-labile.

3. The method of claim 1, said anti-reflective composition further comprising a vinyl ether crosslinker.

4. The method of claim 1, said method further comprising crosslinking said anti-reflective layer after said forming (b).

5. The method of claim 4, wherein said crosslinking yields an anti-reflective layer that is substantially insoluble in photoresist solvents.

6. The method of claim 4, wherein said adamantyl groups do not participate in said crosslinking.

7. The method of claim 4, said method further comprising
   (d) exposing said imaging layer and said anti-reflective layer to radiation to yield exposed portions of said imaging layer and said anti-reflective layer.

8. The method of claim 7, said method further comprising:
   (e) contacting said imaging layer and said anti-reflective layer with a developer so as to remove said exposed portions from said substrate surface.

9. The method of claim 7, wherein said exposing results in decrosslinking said anti-reflective layer.

10. The method of claim 9, wherein said decrosslinked anti-reflective layer comprises free adamantyls.

11. The method of claim 7, said anti-reflective layer having an initial solubility in a base developer, wherein after said exposing (d), said exposed portion of said anti-reflective layer has a final solubility in base developer, said final solubility being greater than said initial solubility.

12. The method of claim 7, wherein said imaging layer generates an acid during said exposing (d) which decrosslinks said exposed portions of said anti-reflective layer.

13. The method of claim 1, said polymer being formed from the polymerization of a first compound selected from the group consisting of adamantyl acrylates and adamantyl methacrylates with a second compound selected from the group consisting of styrenics, acrylics, methacrylics, vinylics, vinyl ethers, derivatives thereof, and combinations thereof.

14. A microelectronic structure comprising:
   a substrate having a surface;
   a cured anti-reflective layer adjacent said substrate surface, said anti-reflective layer being formed from an anti-reflective composition comprising a polymer dissolved or dispersed in a solvent system, said polymer comprising recurring monomeric units having adamantyl groups, wherein said anti-reflective composition comprises less than about 0.005% by weight acid generator, based upon the total weight of the composition taken as 100% by weight; and
   a photoresist layer adjacent said anti-reflective layer.

15. The structure of claim 14, said anti-reflective composition further comprising a vinyl ether crosslinker.

16. The structure of claim 14, said anti-reflective layer being wet developable.

17. The structure of claim 14, said adamantyl groups being acid-labile.

18. The structure of claim 14, said substrate being selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, ion implant layers, titanium nitride, hafnium oxide, silicon oxynitride, and mixtures of the foregoing.

19. An anti-reflective composition comprising a crosslinkable polymer and a crosslinking agent dissolved or dispersed in a solvent system, said polymer comprising recurring monomeric units having adamantyl groups and recurring monomeric units having acid groups, said anti-reflective composition comprising less than about 0.005% by weight acid generator, based upon the total weight of the composition taken as 100% by weight.

20. The composition of claim 19, said adamantyl groups being acid-labile.

21. The composition of claim 19, wherein said recurring monomeric units having acid groups are selected from the group consisting of

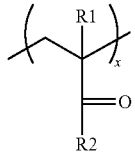
(I)

wherein:
   each R1 is selected from the group consisting of —H, branched and unbranched alkyls, and cyclics; and
   each R2 is individually selected from the group consisting of —OH, -L-OH, —COOH, L-COOH, and -L-C(CF$_3$)$_2$OH, where L can be any suitable linking group.

22. The composition of claim 19, wherein said recurring monomeric units having adamantyl groups are selected from the group consisting of

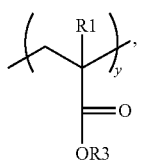
(II)

wherein:
   each R1 is selected from the group consisting of branched and unbranched alkyls, and cyclics; and
   each R3 is individually selected from the group consisting of

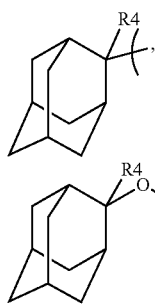

where each R4 is individually selected from the group consisting of branched and unbranched alkyls and cyanoalkyls.

23. The composition of claim 19, wherein said polymer comprises recurring monomers of

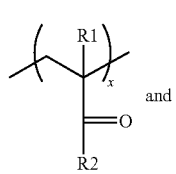
(I)

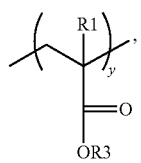
(II)

wherein:
   each R1 is selected from the group consisting of —H, branched and unbranched alkyls, and cyclics;
   each R2 is individually selected from the group consisting of —OH, -L-OH, —COOH, -L-COOH, and -L-C(CF$_3$)$_2$OH, where L can be any suitable linking group; and
   each R3 is individually selected from the group consisting of

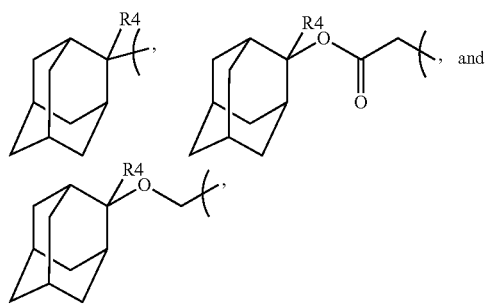

where each R4 is individually selected from the group consisting of branched and unbranched alkyls and cyanoalkyls.

24. The composition of claim 19, said composition further comprising a dye.

25. The composition of claim 24, wherein said dye is bonded to said polymer.

26. The composition of claim 19, wherein said crosslinking agent is a vinyl ether crosslinker.

27. The composition of claim 19, said solvent system being selected from the group consisting of ethyl lactate, propylene glycol methyl ether acetate, propylene glycol methyl ether, propylene glycol n-propyl ether, cyclohexanone, gamma-butyrolactene, and mixtures thereof.

* * * * *

UNITED STATES PATENT AND TRADEMARK OFFICE
CERTIFICATE OF CORRECTION

PATENT NO.        : 8,383,318 B2
APPLICATION NO.   : 12/708630
DATED             : February 26, 2013
INVENTOR(S)       : Meador et al.

Page 1 of 1

It is certified that error appears in the above-identified patent and that said Letters Patent is hereby corrected as shown below:

In the Specification

Column 9, line 29, the text including the term "gamma-butyrolactene" should read:
-- gamma-butyrolactone --

In the Claims

Column 34, lines 54-55, Claim 27, the text including the term "gamma-butyrolactene" should read:
-- gamma-butyrolactone --

Signed and Sealed this
Tenth Day of February, 2015

Michelle K. Lee
*Deputy Director of the United States Patent and Trademark Office*